(12) United States Patent
Ueta

(10) Patent No.: US 12,402,472 B2
(45) Date of Patent: Aug. 26, 2025

(54) LIGHT-EMITTING ELEMENT AND DISPLAY DEVICE, AND PRODUCTION METHOD FOR LIGHT-EMITTING ELEMENT

(71) Applicant: SHARP KABUSHIKI KAISHA, Sakai (JP)

(72) Inventor: Yoshihiro Ueta, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 613 days.

(21) Appl. No.: 17/772,425

(22) PCT Filed: Nov. 7, 2019

(86) PCT No.: PCT/JP2019/043748
§ 371 (c)(1),
(2) Date: Apr. 27, 2022

(87) PCT Pub. No.: WO2021/090450
PCT Pub. Date: May 14, 2021

(65) Prior Publication Data
US 2022/0376008 A1    Nov. 24, 2022

(51) Int. Cl.
| | |
|---|---|
| H10K 50/16 | (2023.01) |
| H10K 50/818 | (2023.01) |
| H10K 59/12 | (2023.01) |
| H10K 59/122 | (2023.01) |
| H10K 59/80 | (2023.01) |
| H10K 71/00 | (2023.01) |

(52) U.S. Cl.
CPC .......... *H10K 50/16* (2023.02); *H10K 59/122* (2023.02); *H10K 71/00* (2023.02); *H10K 50/818* (2023.02); *H10K 59/1201* (2023.02); *H10K 59/80518* (2023.02)

(58) Field of Classification Search
CPC .. H10K 59/122; H10K 59/1201; H10K 71/00; H10K 50/16; H10K 50/818; H10K 59/80518
USPC .............................................. 257/40, 59, 98
See application file for complete search history.

(56) References Cited

U.S. PATENT DOCUMENTS

| | | | |
|---|---|---|---|
| 2002/0121859 A1 | 9/2002 | Hayashi et al. | |
| 2006/0017375 A1* | 1/2006 | Noguchi | H10K 50/828 313/506 |
| 2009/0009062 A1* | 1/2009 | Kathirgamanathan | H10K 50/14 313/504 |

(Continued)

FOREIGN PATENT DOCUMENTS

| | | |
|---|---|---|
| JP | 2002-260843 A | 9/2002 |
| JP | 2007-188779 A | 7/2007 |

*Primary Examiner* — Eric W Jones
(74) *Attorney, Agent, or Firm* — ScienBiziP, P.C.

(57) ABSTRACT

A light-emitting element includes: a first electrode; a first carrier transport layer in electrical contact with the first electrode; a second electrode separated from the first electrode; a second carrier transport layer in electrical contact with the second electrode; and a light-emitting layer, wherein at least part of the light-emitting layer overlaps on part of the first carrier transport layer, and part of the light-emitting layer overlaps on part of the second carrier transport layer, and in plan view, the first carrier transport layer and the second carrier transport layer face each other with the light-emitting layer provided in between.

13 Claims, 32 Drawing Sheets

(56) References Cited

U.S. PATENT DOCUMENTS

| | | | |
|---|---|---|---|
| 2009/0130788 A1* | 5/2009 | Koo | H10K 50/865 |
| | | | 257/E21.159 |
| 2014/0091285 A1* | 4/2014 | Shin | H10K 59/124 |
| | | | 438/34 |
| 2015/0243704 A1* | 8/2015 | Lee | H10K 50/856 |
| | | | 438/22 |
| 2018/0374979 A1* | 12/2018 | Nozawa | H10K 30/40 |
| 2019/0006443 A1* | 1/2019 | Hanashima | H10K 59/122 |
| 2021/0336188 A1* | 10/2021 | Liu | H10K 71/611 |

* cited by examiner

LIGHT-EMITTING ELEMENT AND DISPLAY DEVICE, AND PRODUCTION METHOD FOR LIGHT-EMITTING ELEMENT

TECHNICAL FIELD

The disclosure relates to a light-emitting element and a display device, and a manufacturing method for the light-emitting element.

BACKGROUND ART

In recent years, self-emitting light-emitting elements, using quantum dots or an organic light-emitting material for a light-emitting layer, have been actively developed. Such a light-emitting element is generally manufactured by layering layers, forming the light-emitting element, on a substrate, sequentially in a direction perpendicular to a substrate plane. For example, a light-emitting element described in PTL 1 has a structure in which a first electrode, a function layer including a light-emitting layer, and a second electrode covering the function layer are layered on a substrate in this order.

CITATION LIST

Patent Literature

PTL 1: JP 2007-188779 A

SUMMARY

Technical Problem

As described above, the known light-emitting element generally has a structure in which the electrode or the function layer, such as a carrier transport layer, is layered on the light-emitting layer while being in contact with the light-emitting layer. In many cases, the light-emitting element includes a pair of electrodes and a pair of carrier transport layers, and has a structure in which one of the pair of carrier transport layers and one of the pair of electrodes are layered on the light-emitting layer.

Thus, carrier injection to and light extraction from the known light-emitting element are both performed in directions perpendicular to the substrate plane (opposite orientations along the same direction). The known light-emitting element has the electrodes and the carrier transport layer provided on a light extraction path through which light is extracted from the light-emitting layer. Thus, the known light-emitting element is affected by light absorption or by a difference in refractive index caused by the electrodes and the carrier transport layer provided on the light extraction path.

The electrodes and the carrier transport layer provided on the light extraction path need to be light-transmissive. Thus, the electrodes and the carrier transport layer are under a restriction that a transparent material needs to be used. Unfortunately, development of a material that has both conductive and optical properties suitable for carrier injection is extremely difficult. Even if such a material is successfully developed, there will still be problems in terms of film formation process, cost, or the like.

An object of one aspect of the disclosure is to provide a light-emitting element and a display device, and a manufacturing method for the light-emitting element featuring a higher degree of freedom in terms of selection in the materials of the electrodes and the carrier transport layer than in known cases, and enabling improvement in the light extraction efficiency.

Solution to Problem

In order to solve the problems described above, a light-emitting element according to an aspect of the disclosure includes: a first electrode; a first carrier transport layer in electrical contact with the first electrode; a second electrode separated from the first electrode; a second carrier transport layer in electrical contact with the second electrode; and a light-emitting layer, in which at least part of the light-emitting layer overlaps on part of the first carrier transport layer, and part of the light-emitting layer overlaps on part of the second carrier transport layer, and in plan view, the first carrier transport layer and the second carrier transport layer face each other with the light-emitting layer provided in between.

In order to solve the problems described above, a display device according to an aspect of the disclosure includes the above-described light-emitting element according to an aspect of the disclosure.

In order to solve the problems described above, a manufacturing method for a light-emitting element according to an aspect of the disclosure is a manufacturing method for a light-emitting element including a first electrode, a first carrier transport layer in electrical contact with the first electrode, a second electrode separated from the first electrode, a second carrier transport layer in electrical contact with the second electrode, and a light-emitting layer, at least part of the light-emitting layer overlapping on part of the first carrier transport layer, and part of the light-emitting layer overlapping on part of the second carrier transport layer, and in plan view, the first carrier transport layer and the second carrier transport layer facing each other with the light-emitting layer provided in between, the manufacturing method including: forming the first carrier transport layer; forming the second carrier transport layer separated from the first carrier transport layer; and forming the light-emitting layer in a space portion between the first carrier transport layer and the second carrier transport layer in plan view.

Advantageous Effects of Disclosure

One aspect of the disclosure can provide a light-emitting element and a display device, and a manufacturing method for the light-emitting element featuring a higher degree of freedom in terms of selection in the materials of the electrodes and the carrier transport layer than in known cases, and enabling improvement in the light extraction efficiency.

DESCRIPTION OF EMBODIMENTS

First Embodiment

Hereinafter, an embodiment of the disclosure will be described. In addition, a "lower layer" means a layer that is formed in a process prior to that of a comparison layer, and an "upper layer" means a layer that is formed in a process after that of a comparison layer.

Schematic Configuration of Display Device 100 and Light-Emitting Element 10

Figure 1:
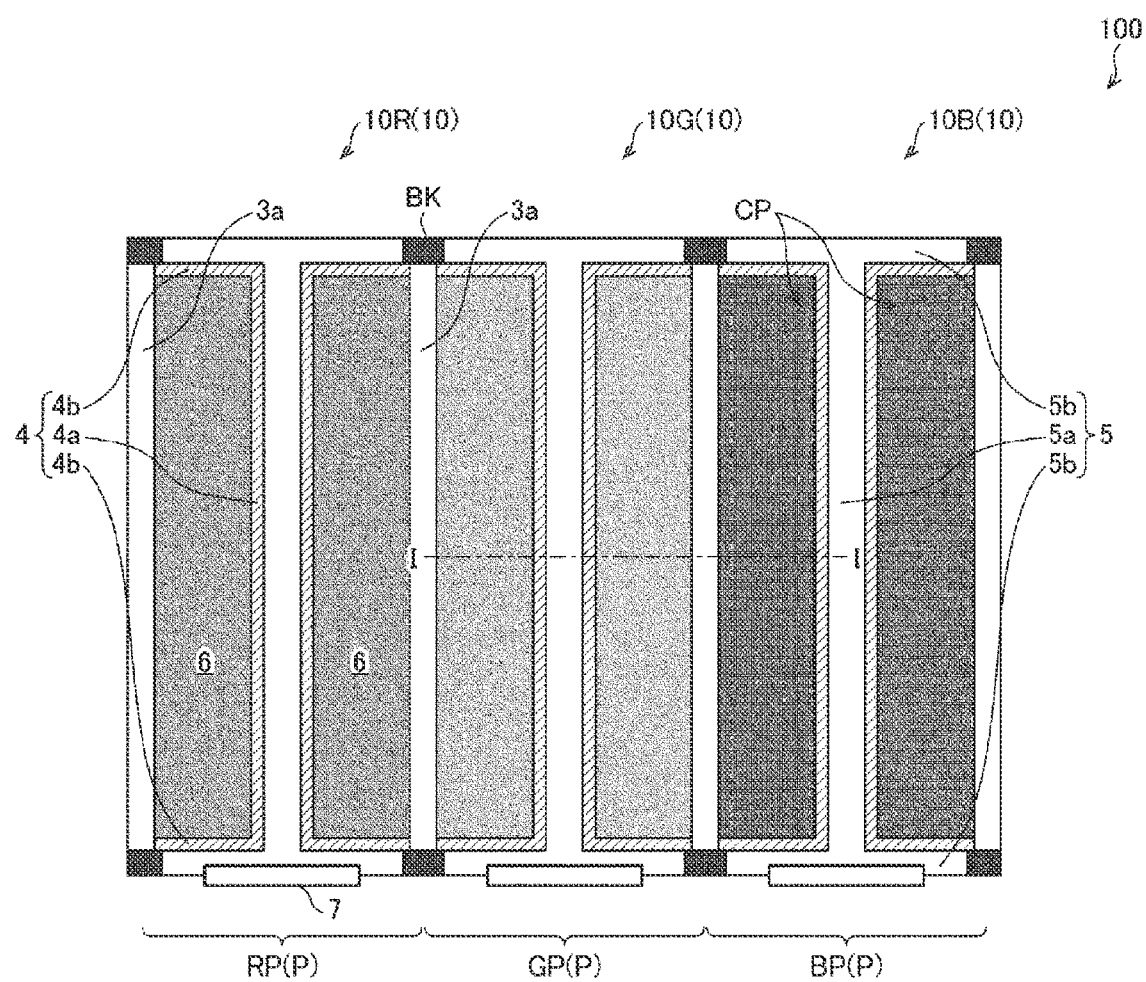
FIG. 1 is a perspective view illustrating a schematic configuration of main portions of a display device according to a first embodiment, as viewed from the upper side.
Figure 2:
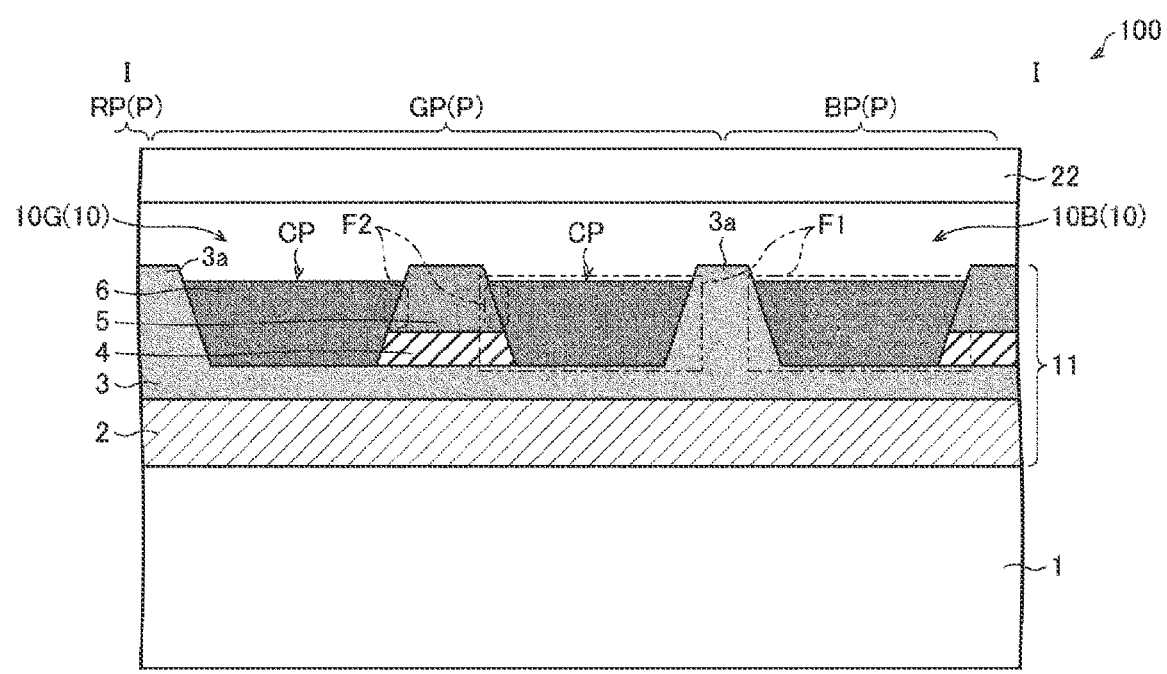
FIG. 2 is a cross-sectional view illustrating a schematic configuration of main portions of the display device illustrated in FIG. 1 taken along line I-I in FIG. 1.
Figure 3:
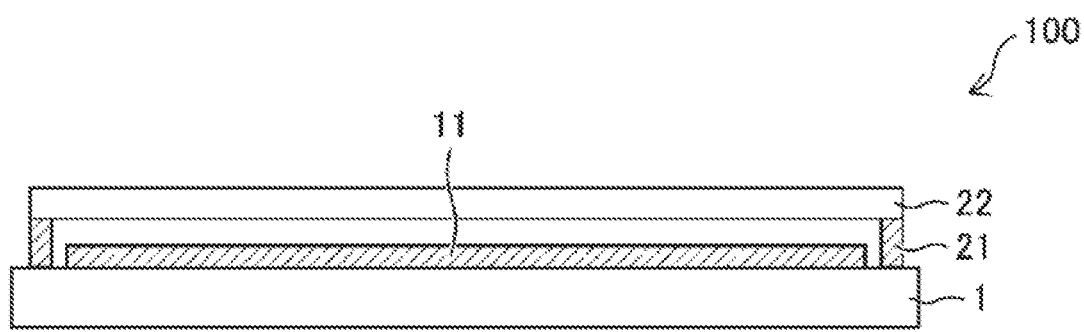
FIG. 3 is a cross-sectional view illustrating a schematic configuration of the display device according to the first embodiment.

FIG. 1 is a perspective view illustrating a schematic configuration of main portions of a display device 100 according to the present embodiment as viewed from the upper side. FIG. 2 is a cross-sectional view illustrating a schematic configuration of main portions of the display device 100 illustrated in FIG. 1 taken along line I-I in FIG. 1. FIG. 3 is a cross-sectional view illustrating a schematic configuration of the display device 100 according to the present embodiment. Note that in FIG. 1, an upper surface of the display device 100 as seen through a sealing substrate 22 is illustrated.

As illustrated in FIG. 1, the display device 100 includes, for example, a red pixel RP, a green pixel GP, and a blue pixel BP. The red pixel RP is provided with a light-emitting element 10R that emits red light. The green pixel GP is provided with a light-emitting element 10G that emits green light. The blue pixel BP is provided with a light-emitting element 10B that emits blue light.

Here, the red light refers to light having a light emission peak wavelength in a wavelength band equal to or longer than 600 nm and equal to or shorter than 780 nm. The green light refers to light having a light emission peak wavelength in a wavelength band equal to or longer than 500 nm and equal to or shorter than 600 nm. The blue light refers to light having a light emission peak wavelength in a wavelength band equal to or longer than 400 nm and equal to or shorter than 500 nm.

Preferably, the light-emitting element 10R has a light emission peak wavelength in a wavelength band equal to or longer than 620 nm and equal to or shorter than 650 nm. Preferably, the light-emitting element 10G has a light emission peak wavelength in a wavelength band equal to or longer than 520 nm and equal to or shorter than 540 nm. Preferably, the light-emitting element 10B has a light emission peak wavelength in a wavelength band equal to or longer than 440 nm and equal to or shorter than 460 nm.

Note that the present embodiment is not limited to the configuration described above, and a light-emitting element emitting light having a light emission peak wavelength in a wavelength band other than those described above may be provided.

Hereinafter, when there is no need to distinguish the light-emitting elements 10R, 10G, and 10B from one another, these light-emitting elements 10R, 10G, and 10B are collectively referred to simply as a "light-emitting element 10". When there is no need to distinguish the pixels RP, GP, and BP from one another, these pixels RP, GP, and BP are collectively referred to simply as a "pixel P". As described above, the display device 100 includes a plurality of pixels P, and includes the light-emitting element 10 corresponding to the pixel P for each of the pixels P.

Note that for convenience of description given below, an anode is referred to as "AN", a hole transport layer is referred to as "HTL", and an insulating layer is referred to as "IL". Furthermore, an electron transport layer is referred to as "ETL", a light-emitting layer is referred to as "EML", and a cathode is referred to as "CA".

As illustrated in FIG. 1 and FIG. 2, the light-emitting element 10 includes an AN 2, an HTL 3, an IL 4, an ETL 5, an EML 6, a CA 7, and a bank BK.

As illustrated in FIG. 3, the display device 100 includes a substrate 1 as a support body, a light-emitting element layer 11 including a plurality of the light-emitting elements 10, and a sealing resin 21 and the sealing substrate 22 as sealing layers.

As illustrated in FIG. 2, the display device 100 has a configuration in which layers of the light-emitting element 10 are layered, on the substrate 1 as the support body, to be the light-emitting element layer 11 including the plurality of light-emitting elements 10. In the disclosure, a direction from the substrate 1 side toward the sealing substrate 22 side is referred to as "upper side", and a direction from the sealing substrate 22 side toward the substrate 1 side is referred to as "lower side".

As illustrated in FIG. 3, the sealing resin 21 is provided to be in a frame-like shape at four side end portions of a display region in the display device 100. The sealing substrate 22 is bonded to the substrate 1 with the sealing resin 21 provided in between. The sealing substrate 22 covers the plurality of light-emitting elements 10 provided in the light-emitting element layer 11. Thus, the light-emitting elements 10 are sealed by the sealing resin 21 and the sealing substrate 22 so as not to be deteriorated by moisture and oxygen in the atmosphere. As the sealing substrate 22, a glass substrate (sealing glass) can be used, for example.

Hereinafter, a case is described as an example in which a lower electrode (first electrode) is the AN 2 and an upper electrode (second electrode) is the CA 7. However, the present embodiment is not limited thereto, and the lower electrode (first electrode) may be the CA 7 and the upper electrode (second electrode) may be the AN 2.

The substrate 1 is an array substrate. The substrate 1 is provided with a drive circuit (not illustrated), as a pixel circuit, including a plurality of drive elements, such as thin film transistors (TFTs), driving the light-emitting elements 10.

With the AN 2 (first electrode) made of a conductive material, positive holes are injected into the EML 6 via the HTL 3. The AN 2 is a common layer common to the pixels P, and is formed, on the substrate 1, to be in a solid form to cover the surface of the substrate 1. The AN 2 is electrically connected to the TFT (specifically, the drain electrode of the TFT, for example) of the substrate 1.

The display device 100 according to the present embodiment is a top-emitting display device in which light generated by the EML 6 is emitted from the side opposite to the substrate 1, and has a light-reflective electrode used for the lower electrode. Thus, examples of the above-described conductive material used in the AN 2 include known metals commonly used in anodes such as Al (aluminum), Ag (silver), and Mg (magnesium); alloys of these metals; and the like. If the upper electrode is the AN 2, the above-described conductive material may be: an inorganic oxide such as ITO (indium tin oxide) and InGaZnOx (indium gallium zinc oxide); conductive compounds obtained by doping these inorganic oxides with impurities; and the like. These conductive materials may be used alone, or two or more kinds thereof may be used in combination as appropriate.

The HTL 3 (first carrier transport layer) is a layer with which positive holes are transported from the AN 2 to the EML 6, and is in electrical contact with the AN 2. The HTL 3 is a common layer common to the pixels P, and is formed, on the AN 2, to be in a solid form to cover the surface of the AN 2.

The HTL 3 includes a plurality of protruding portions 3a protruding toward the upper side. The protruding portions 3a are provided to protrude in a direction perpendicular to the surface of the substrate 1 for example. The protruding portions 3a are formed to be in a stripe shape in plan view for example.

In the display region of the display device 100, the plurality of pixels P are arranged in a matrix shape along a lateral direction (a row direction, a first direction), and a vertical direction (a column direction, a second direction) perpendicular to the lateral direction in plan view. Each pixel P is formed, for example, in a rectangular shape. The protruding portions 3a are provided on the boundary, along the vertical direction, between pixels P adjacent to each other in the lateral direction, while being separated from each other along the boundary (that is, the vertical direction), in plan view for example.

The HTL 3 may be opaque. The HTL 3 does not cover the upper side of the EML 6, and thus does not need to be transparent. Thus, the HTL 3 may be transparent or opaque. For the HTL 3, a material with electronic physical properties suitable for the materials used for the AN 2 and the EML 6 can be selected. When the HTL 3 is opaque, the protruding portions 3a can be used as a shadow mask that prevents interference of light. Note that when the lower electrode is the CA 7, and the upper electrode is the AN 2, the HTL 3 is preferably transparent, but does not necessarily need to be transparent.

The material of the HTL 3 may be any hole transport material with which holes can be stably transported into the EML 6. Among such materials, one featuring high hole mobility is preferable.

A known hole transport material can be used as the material of the HTL 3. When a semiconductor material, among such materials, is used as the material of the HTL 3, the HTL 3 can be easily processed, because a manufacturing method for a TFT backplane in the substrate 1 can also be applied for the process. Thus, such a material is advantageous in terms of process. In the present embodiment, the HTL 3 does not cover the upper side of the EML 6, and thus does not need to be transparent as described above. This means that a typical semiconductor material can be used as the material of the HTL 3 without problem. The use of the semiconductor material as the material of the HTL 3 also enables the hole density, that is, the carrier density to be easily increased, so that the HTL 3 can have a low resistance. As a result, low resistance ohmic contact can be achieved. In the present embodiment, the optical characteristics of the carrier transport layer do not need to be taken into consideration, and thus a low resistance p-type semiconductor can be used for the HTL 3.

Examples of the above-described semiconductor material used in the HTL 3 include Si (silicon), an oxide semiconductor (metal oxide), a group IV semiconductor, a group II-VI compound semiconductor, a group III-V compound semiconductor, and the like. Examples of the oxide semiconductor (metal oxide) include $MoO_3$ (molybdenum trioxide), $Cr_2O_3$ (chromium oxide), NiO (nickel oxide), $WO_3$ (tungsten trioxide), ITO (indium tin oxide), InGaZnOx (indium gallium zinc oxide), $Ga_2O_3$ (gallium oxide), $In_2O_3$ (indium oxide), and the like. Note that the distinction between oxide semiconductors and metal oxides is not necessarily clear, and metal oxides are also referred to as oxide semiconductors. Note that the use of a metal oxide as the material of the HTL 3 is not disadvantageous in obtaining a function as the HTL 3. Examples of the above-described group IV semiconductor include Si (silicon), Ge (germanium), and the like. Examples of the above-described group II-VI compound semiconductor include IZO (indium-doped zinc oxide), ZAO (aluminum-doped zinc oxide), ZnO (zinc oxide), MgO (magnesium oxide), ZnMgO (zinc magnesium oxide), ZnS (zinc sulfide), ZnSe (zinc selenide), ZnSSe (zinc sulfide selenide), MgS (magnesium sulfide), MgSe (magnesium selenide), MgSSe (magnesium sulfide selenide), and the like. Examples of the above-described group III-V compound semiconductor include AlAs (aluminum arsenide), GaAs (gallium arsenide), InAs (indium arsenide), and AlGaInAs (aluminum gallium indium arsenide), which is a mixed crystal of these; MN (aluminum nitride), GaN (gallium nitride), InN (indium nitride), and AlGaInN (aluminum gallium indium nitride), which is a mixed crystal of these; GaP (gallium phosphide), AlGaInP (aluminum gallium indium phosphide), and the like. Note that the above-described hole transport materials are merely examples, and are not limited only to the above-described materials. In addition, one kind of these hole transport materials may be used, or two or more kinds thereof may be mixed and used as appropriate.

The HTL 3 may have a function of inhibiting transport of electrons. In this case, the hole transport material is preferably an electron blocking material capable of preventing the penetration of electrons that have traveled from the ETL 5. This makes it possible to increase the recombination efficiency of the positive holes and electrons within the EML 6. Furthermore, the HTL 3 may also have a function of a hole injection layer that facilitates injection of positive holes from the AN 2 to the EML 6.

A plurality of the ILs 4 are formed in an island shape, on the HTL 3. On each of the ILs 4, the ETL 5 (second carrier transport layer) is formed in an island shape protruding toward the upper side, to face the protruding portion 3a in plan view. The ETL 5 is formed on the HTL 3 with the IL 4 provided in between.

In the present embodiment, the IL 4 provides insulation between the HTL 3 and the ETL 5. The ETL 5 (second carrier transport layer) is a layer with which electrons are transported from the CA 7 to the EML 6, and is in electrical contact with the CA 7.

The ETL 5 has a shape geometrically similar to that of the IL 4. The IL 4 and the ETL 5 are formed in a shape of the letter I in plan view, for example.

In plan view, the ETL 5 includes: vertical line portions 5a serving as a main line portion extending in the vertical direction that is the extending direction of the protruding portion 3a; and lateral line portions 5b serving as branch line portions, positioned at both end portions of each pixel P in the extending direction of the vertical line portion 5a, and extending in the lateral direction (in-plane direction) perpendicular to the vertical line portion 5a. The vertical line portions 5a and the protruding portions 3a are alternately provided, with the vertical line portion 5a provided between adjacent ones of the protruding portions 3a to divide the pixel P in two, for example. The lateral line portions 5b and 5b are each provided on the boundary, along the lateral direction, between pixels P adjacent to each other in the vertical direction, and are separated from each other along the boundary (that is, the lateral direction), in plan view for example.

Similarly, in plan view, the IL 4 includes: vertical line portions 4a serving as a main line portion extending in the vertical direction that is the extending direction of the protruding portion 3a; and lateral line portions 4b serving as branch line portions, positioned at both end portions of each pixel P in the extending direction of the vertical line portion 4a, and extending in the lateral direction perpendicular to the vertical line portion 4a. The vertical line portions 4a and the protruding portions 3a are alternately provided, with the vertical line portion 4a provided between adjacent ones of the protruding portions 3a to divide the pixel P in two, for example. The lateral line portions 4b and 4b are each provided on the boundary, along the lateral direction, between pixels P adjacent to each other in the vertical direction, and are separated from each other along the boundary (that is, the lateral direction), in plan view for example.

The pixel P has four corners provided with the respective banks BK with a height equal to or higher than those of the upper surface of the HTL 3 and the upper surface of the ETL 5. The banks BK provide insulation between the HTL 3 and the ETL 5, at the four corners of the pixel P. The banks BK are opaque, and function, together with the protruding portions 3a and the lateral line portions 4b and 5b, as separation walls with which the pixels P are separated from each other (that is, the light-emitting elements 10 are separated from each other).

The pixels P are each surrounded by the lateral line portions 4b and 5b, the protruding portion 3a, and the banks BK in plan view.

The IL 4 is a light-transmissive insulating layer. Note that the IL 4 is preferably a transparent insulating layer. A known transparent insulating material can be used as the material of the IL 4. Examples of the above-described transparent insulating material include inorganic insulating materials such as $SiO_2$ (silicon oxide), SiN (silicon nitride), and SION (silicon oxynitride); and organic insulating materials such as silicone resins, epoxy resins, acrylic resins, and fluorine resins.

The ETL 5 is preferably transparent, but does not necessarily need to be transparent. For the ETL 5, a material with electronic physical properties suitable for the materials used for the CA 7 and the EML 6 can be selected. Note that when the lower electrode is the CA 7, and the upper electrode is the AN 2, an opaque material is selected as the material of the ETL 5. When the ETL 5 is opaque, the ETL 5 can be used as a shadow mask that prevents interference of light.

A known electron transport material can be used for ETL 5. When a semiconductor material, among such materials, is used as the material of the ETL 5, the ETL 5 can be easily processed, because a manufacturing method for a TFT backplane in the substrate 1 can also be applied for the process, as in the case of the HTL 3. Thus, such a material is advantageous in terms of process. In the present embodiment, the ETL 5 does not cover the upper side of the EML 6, and thus does not need to be transparent. This means that a typical semiconductor material can be used as the material of the ETL 5 without problem. The use of the semiconductor material as the material of the ETL 5 also enables the electron density, that is, the carrier density to be easily increased, so that the ETL 5 can have a low resistance. As a result, low resistance ohmic contact can be achieved. As a result, the CA 7 only needs to be in electrical contact with at least a part of the ETL 5, to obtain sufficient current.

In the present embodiment, the optical characteristics of the carrier transport layer do not need to be taken into consideration, and thus a low resistance n-type semiconductor can be used for the ETL 5.

Examples of the above-described semiconductor material used in the ETL 5 include Si, an oxide semiconductor (metal oxide), a group II-VI compound semiconductor, a group III-V compound semiconductor, a group IV-IV compound semiconductor, and the like. Examples of the above-described oxide semiconductor (metal oxide) include $MoO_3$, $Cr_2O_3$, NiO, $WO_3$, ITO, InGaZnOx, $Ga_2O_3$, $In_2O_3$, and the like, which are described above. Examples of the above-described group II-VI compound semiconductor include IZO, ZAO, ZnO, MgO, ZnMgO, ZnS, ZnSe, ZnSSe, MgS, MgSe, MgSSe, and the like, which are described above. Examples of the above-described group III-V compound semiconductor include AlAs, GaAs, InAs, and AlGaInAs, which is a mixed crystal of these; AlN, GaN, InN, and AlGaInN, which is a mixed crystal of these; GaP, AlInGaP, and the like, which are described above. Examples of the above-described group IV-IV compound semiconductor include semiconductors made of elements different from each other such as SiGe (silicon germanium) and SiC (silicon carbide). One kind of these electron transport materials may be used, or two or more kinds thereof may be mixed and used as appropriate.

The ETL 5 may have a function of inhibiting transport of positive holes. In this case, the electron transport material is preferably a hole blocking material capable of preventing the penetration of holes that have traveled from the AN 2. This makes it possible to increase the recombination efficiency of the positive holes and electrons within the EML 6. Furthermore, the ETL 5 may also have a function of an electron injection layer that facilitates injection of electrons from the CA 7 to the EML 6.

The banks BK may be formed of an organic insulating material, such as a polyimide resin and an acrylic resin for example.

The EML 6 is a layer that includes a light-emitting material, and emits light through recombination between the electrons transported from the CA 7 and the positive holes transported from the AN 2.

The EML 6 is formed in a recessed portion CP surrounded by the HTL 3, the IL 4, the ETL 5, and the bank BK. In other words, the EML 6 is formed in the recessed portion CP including as parts of the side walls, the protruding portions 3a, the IL 4, the ETL 5, and the banks BK. The protruding portion 3a faces the IL 4 and the ETL 5 with the EML 6 provided in between, in plan view. The light-emitting element 10 emits light from the side and bottom surfaces of the recessed portion CP.

The protruding portion 3a, the IL 4, and the ETL 5 each have a forwardly tapered shape in cross-sectional view. More specifically, the protruding portion 3a, the IL 4, and the ETL 5 each have a trapezoidal cross-sectional shape with the upper end being smaller than the lower end. The IL 4 and the ETL 5 are formed to have side surfaces being flush.

The EML 6 is formed to overlap on part of the HTL 3, as illustrated in an area surrounded by a frame F1 illustrated in a two-dot chain line in FIG. 2. The EML 6 is formed to have a portion overlapping on part of the protruding portion 3a. The EML 6 is formed to have a portion overlapping on part of the ETL 5, as illustrated in an area surrounded by a frame F2 illustrated in two-dot chain lines in FIG. 2.

The EML 6 may, for example, include a nano-sized quantum dot phosphor (hereinafter, referred to as "QD"), as the light-emitting material. A known QD can be employed for this QD. The QD may include, for example, at least one type of semiconductor material formed of an element of at least one type selected from the group consisting of Cd (cadmium), S (sulfur), Te (tellurium), Se (selenium), Zn (zinc), In (indium), N (nitrogen), P (phosphorus), As (arsenic), Sb (antimony), Al (aluminum), Ga (gallium), Pb (lead), Si (silicon), Ge (germanium), and Mg (magnesium). Further, the QD may be a two-component core type, a three-component core type, a four-component core type, a core-shell type, or a core multi-shell type. Further, the QD may include nanoparticles doped with at least one type of the elements described above or may include a composition-gradient structure.

However, the present embodiment is not limited to the above example. The EML 6 may include, instead of the QD, an organic light-emitting material that emits light in various colors as the light-emitting material, for example.

When the light-emitting element 10 is a quantum dot light-emitting diode (QLED) including the QD as the light-emitting material as described above, drive current between the AN 2 and the CA 7 causes the recombination between the positive holes and the electrons in the EML 6. Then, as the resultant excitons transition from the QD conduction band level to the valence electron band level, light (fluorescence) is emitted.

On the other hand, when the light-emitting element 10 is an organic light-emitting diode (OLED) including an organic light-emitting material as the light-emitting material, drive current between the AN 2 and the CA 7 causes the recombination between the positive holes and the electrons in the EML 6. Light is emitted as the resultant excitons transition to a ground state.

Note that the light-emitting element 10 may be a light-emitting element (such as an inorganic light-emitting diode for example) other than the OLED or QLED.

With the CA 7 (second electrode) made of a conductive material, electrons are injected into the EML 6 via the ETL 5. As illustrated in FIG. 1, the CA 7 is separated from the AN 2 and is formed so as not to be in contact with the EML 6 while being in contact with at least part of the upper surface of the ETL 5, for example.

The CA 7 may be in electrical contact with part of the ETL 5, without being positioned on the upper side of the EML 6. On the EML 6, the sealing substrate 22 covering the light-emitting element 10 is provided adjacent to the EML 6.

As described above, the ETL 5 is made of, for example, an opaque semiconductor material having a low resistance. According to the present embodiment, the semiconductor material is used as the material of the ETL 5 to achieve the low resistance ohmic contact. Thus, there will be no problem even if the contact area between the CA 7 and the ETL 5 is small. The CA 7 can be routed between adjacent pixels P and also functions as a shadow mask.

Examples of the above-described conductive material used in the CA 7 include known metals commonly used in cathodes such as Al, Ag, and Mg; alloys of these metals; inorganic oxides such as ZnO (zinc oxide), ITO (indium tin oxide), and InGaZnOx (indium gallium zinc oxide); conductive compounds obtained by doping these inorganic oxides with impurities; and the like. These conductive materials may be used alone, or two or more kinds thereof may be used in combination as appropriate. Furthermore, the alloy may further include Li (lithium).

In the light-emitting element 10, the layer thicknesses of the layers other than the IL 4 and the EML 6 can be set as in known light-emitting elements.

The layer thickness of the EML 6 is set to be a thickness capable of providing a site for the recombination between electrons and positive holes, so that the light emitting function can be implemented. When the QD is used for the EML 6 for example, the layer thickness of the EML 6 is preferably about several times larger than the outermost particle size of the QD.

The particle size of the QD can be set as in known cases. The particle size of the core of the QD is, for example, from 1 to 30 nm, and the outermost particle size of the QDs including the shell is, for example, from 1 to 50 nm. The number of overlapping QD layers in the light-emitting element 10 is, for example, from 1 to 20 layers.

However, when the layer thickness of the EML 6 exceeds 100 nm, the filling of the light-emitting material into the recessed portion CP is difficult. In addition, the HTL 3, the IL 4, and the ETL 5 have a tapered cross-sectional shape, and when the layer thickness of the EML 6 exceeds 100 nm, the heights of the HTL 3 and the ETL 5 become high accordingly. Thus, when the layer thickness of the EML 6 exceeds 100 nm, the cross-sectional area of the EML 6 in a direction parallel to the surface of the EML 6 (the lateral direction in cross-sectional view) becomes large accordingly. As a result, the carrier injection density in the lateral direction in cross-sectional view decreases, and the luminous efficiency is compromised. All things considered, the layer thickness of the EML 6 is preferably equal to or less than 100 nm, for the sake of efficient light emission from the EML 6.

In the light-emitting element 10, the cross-sectional area for the passage of current is smaller than those in known light-emitting elements. The current density provides a higher effect for a smaller cross-sectional area. The resistance of the HTL and the ETL in known light-emitting elements are equivalent to that of the EML and thus are not ignorable. On the other hand, the resistance of the HTL and the ETL according to the present embodiment are much smaller than that of the EML and thus are ignorable.

In the present embodiment, the IL 4 is provided only immediately below the ETL 5, and the EML 6 is formed in the recessed portion CP including the protruding portions 3*a*, the IL 4, and the ETL 5 as part of the side walls. Thus, in the present embodiment, the layer thickness of the EML 6 is set to be greater than the layer thickness of the IL 4.

The layer thickness of the IL 4 may be any thickness achieving sufficiently low carrier tunneling probability. The layer thickness of the IL 4 is preferably set to be equal to or greater than 5 nm. The layer thickness of the EML 6 is preferably equal to or greater than 5 nm, for the sake of efficient light emission from the EML 6. Thus, the layer thickness of the EML 6 is preferably in a range from 5 nm to 100 nm, and is more preferably in a range of greater than 5 nm and equal to or less than 100 nm.

The EML 6 is set to have the height of the upper surface of the EML 6 being lower than the heights of the upper surface of the protruding portion 3*a* and the upper surface of the ETL 5. The height of the protruding portion 3*a* is equal to the sum of the layer thickness of the IL 4 and the layer thickness of the ETL 5. Thus, the height of the protruding portion 3*a* of the HTL 3 and the sum the layer thickness of the IL 4 and the layer thickness of the ETL 5 are set to be larger than the layer thickness of the EML 6.

When the QD is used for the light-emitting material of the EML 6 for example, the distance from a protruding portion 3*a* to the adjacent ETL 5 and IL 4 is preferably equal to or longer than twice the particle size of the QD. The recessed portion CP cannot be filled with the QD if the distance from the protruding portion 3*a* to the adjacent ETL 5 and IL 4 is smaller than the particle size of the QD. The distance is preferably a width equal to or longer than twice the particle size of the QD, to fill the recessed portion CP with QD without any gap.

In the present embodiment, when viewed from the upper surface side of the light-emitting element 10, the outer shape size of the EML 6 in each recessed portion CP is equal to a value obtained by the following formula: [length of protruding portion 3*a* in extending direction (=length of vertical line portion 5*a* in extending direction)×[width between protruding portion 3*a* and ETL 5].

Note that the length of the protruding portion 3*a* in the extending direction and the width between the protruding portion 3*a* and the ETL 5 may be set as appropriate depending on the pixel size, and are not particularly limited. As an example, the length of the protruding portion 3*a* in the extending direction is 50 μm for example, and the width between the protruding portion 3*a* and the ETL 5 is set to 0.5 μm.

Preferably, the lower limit of the line width of the protruding portion 3*a* as viewed from the upper surface side of the light-emitting element 10 is 0.25 μm due to the limitation considering the patterning selection ratio, and the upper limit is preferably 50 μm considering the pixel pitch for the 8 K resolution in the diagonal 17 inch size. Thus, the line width of the protruding portion 3*a* as viewed from the upper surface side of the light-emitting element 10 is preferably within a range from 0.25 μm to 50 μm. For the same reason, the line width of the ETL 5 as viewed from the upper surface side of the light-emitting element 10 is also preferably within the range from 0.25 μm to 50 μm. The expression "the line width of the protruding portion 3*a* as viewed from the upper surface side of the light-emitting element 10" means "the minimum line width of the length of the protruding portion 3*a* in a direction perpendicular to the extending direction of the protruding portion 3*a*". The expression "the line width of the ETL 5 as viewed from the upper surface side of the light-emitting element 10" means "the minimum line width of the length of the ETL 5 in a direction perpendicular to the extending direction of the ETL 5".

With general photolithography processes, a sub-micron line width line spacing can be easily processed. Thus, the line width as well as the interelectrode distance described above can be easily processed. Note that with a higher process cost, current processes can process an even shorter line spacing of about 0.1 µm.

The aspect ratio of the EML 6 is in the range from 1 to 5. With the aspect ratio thus being in the range from 1 to 5 and with the layer thickness of the EML 6 being equal to or less than 100 nm, the subpixel width (that is, the width between the protruding portion 3a and the ETL 5) is desirably 0.5 µm at the most.

The present embodiment is free from the concept of forward/reverse structure as in known light-emitting elements, whereby the connection with TFT, carrier injection, and light extraction can be independently optimized.

Manufacturing Method for Light-Emitting Element 10 and Display Device 100

Figure 5:
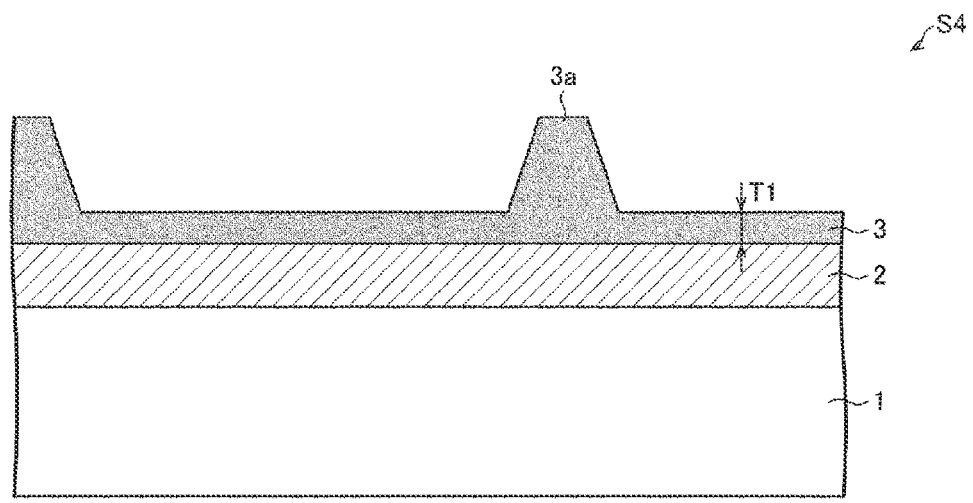
FIG. 5 is another cross-sectional view illustrating, in order, steps as part of manufacturing steps for the light-emitting element in the display device according to the first embodiment.
Figure 5:
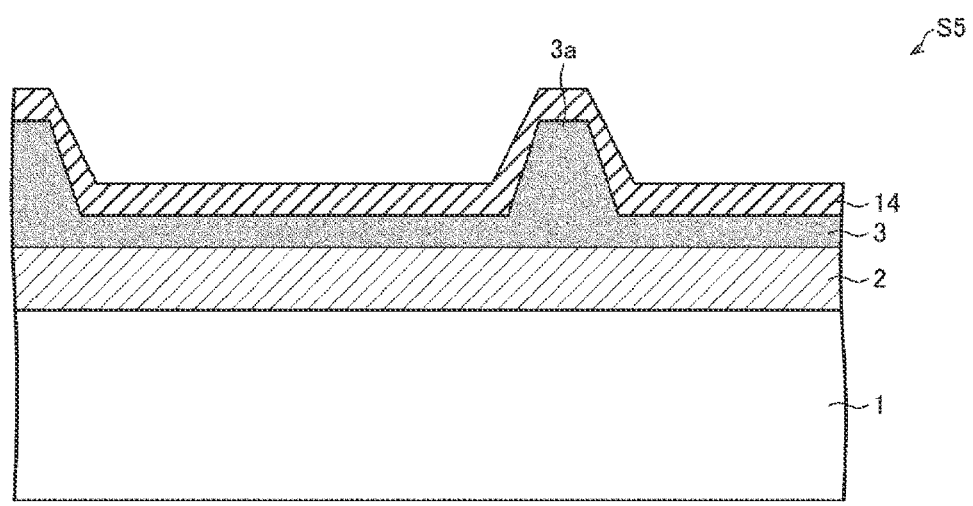
Figure 5:
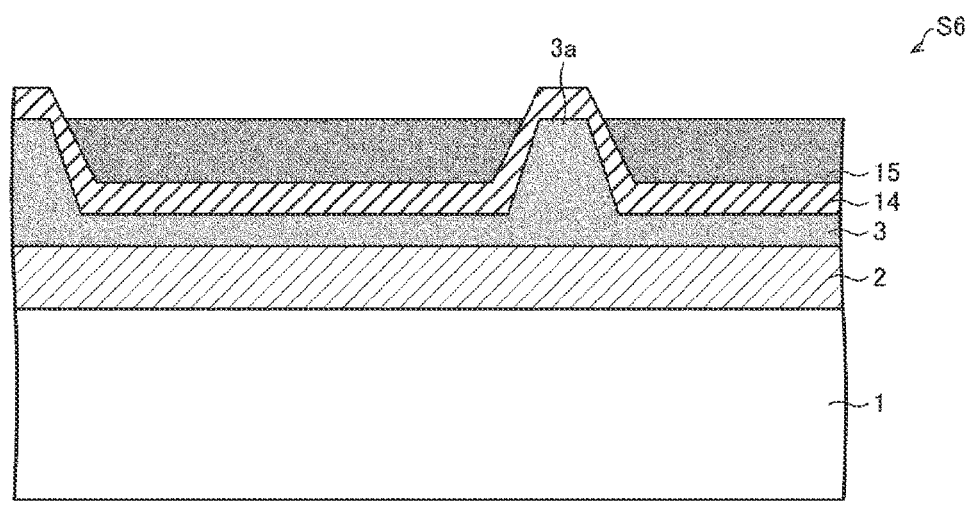
Figure 6:
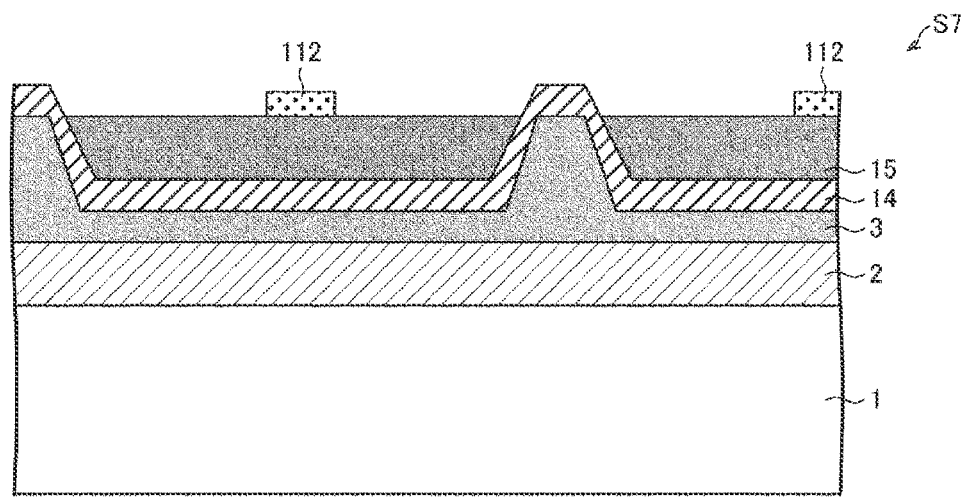
FIG. 6 is still another cross-sectional view illustrating, in order, steps as part of manufacturing steps for the light-emitting element in the display device according to the first embodiment.
Figure 6:
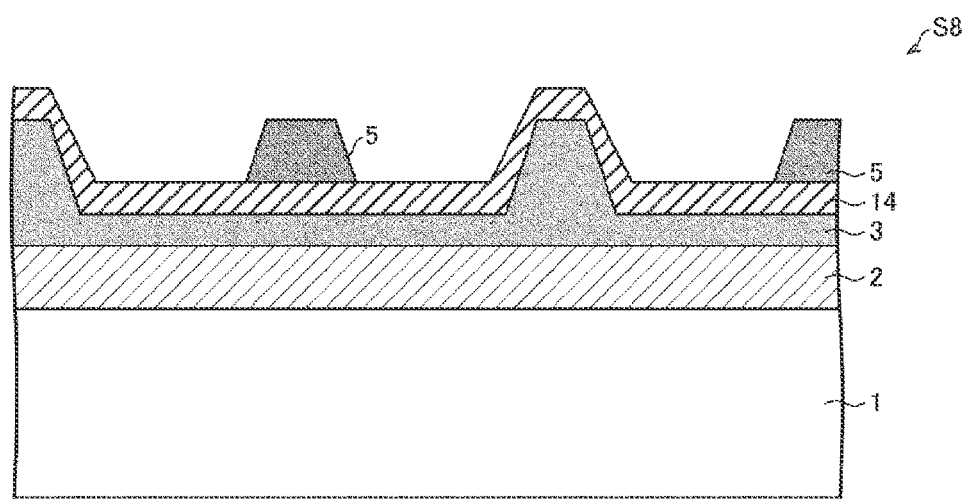
Figure 6:
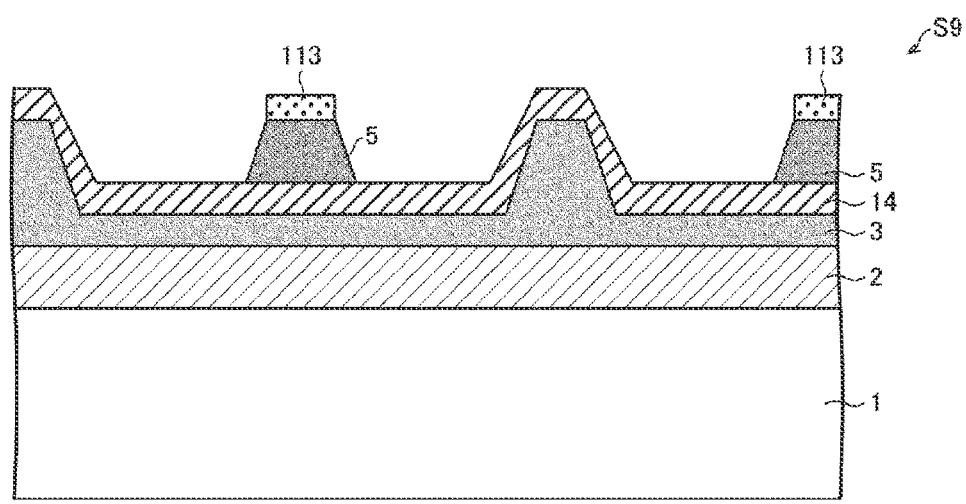
Figure 7:
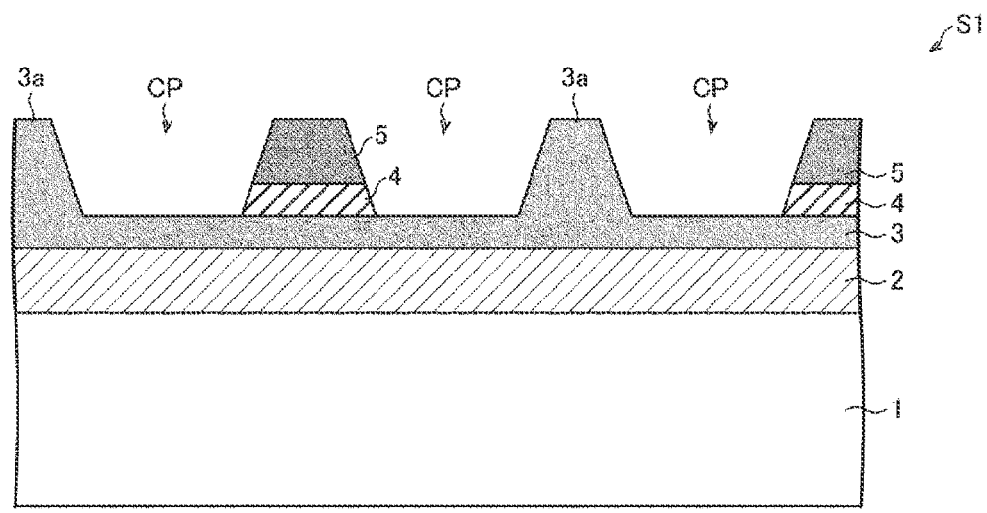
FIG. 7 is still another cross-sectional view illustrating, in order, steps as part of manufacturing steps for the light-emitting element in the display device according to the first embodiment.
Figure 7:
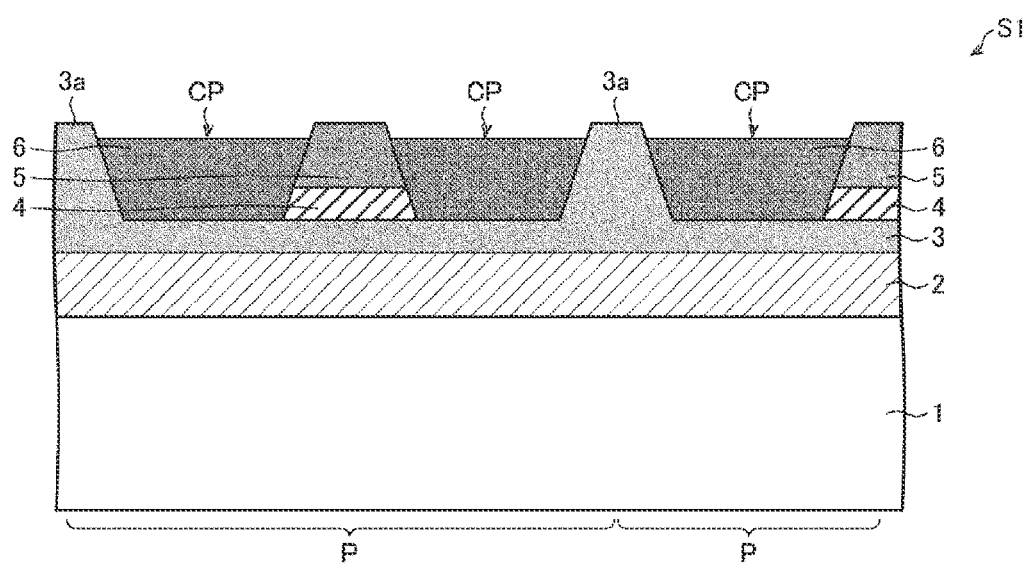

Next, a manufacturing method for the light-emitting element 10 and the display device 100 according to the present embodiment will be described below with reference to FIG. 4 to FIG. 7. FIG. 4 to FIG. 7 are cross-sectional views illustrating, in order, steps as part of manufacturing steps for the light-emitting element 10 in the display device 100 according to the present embodiment. Note that FIG. 4 to FIG. 7 illustrate a cross section of the display device 100 corresponding to the cross section of the light-emitting element 10 illustrated in FIG. 2. FIG. 5 illustrates a manufacturing step after the manufacturing step illustrated in FIG. 4. FIG. 6 illustrates a manufacturing step after the manufacturing step illustrated in FIG. 5. FIG. 7 illustrates a manufacturing step after the manufacturing step illustrated in FIG. 6.

Figure 4:
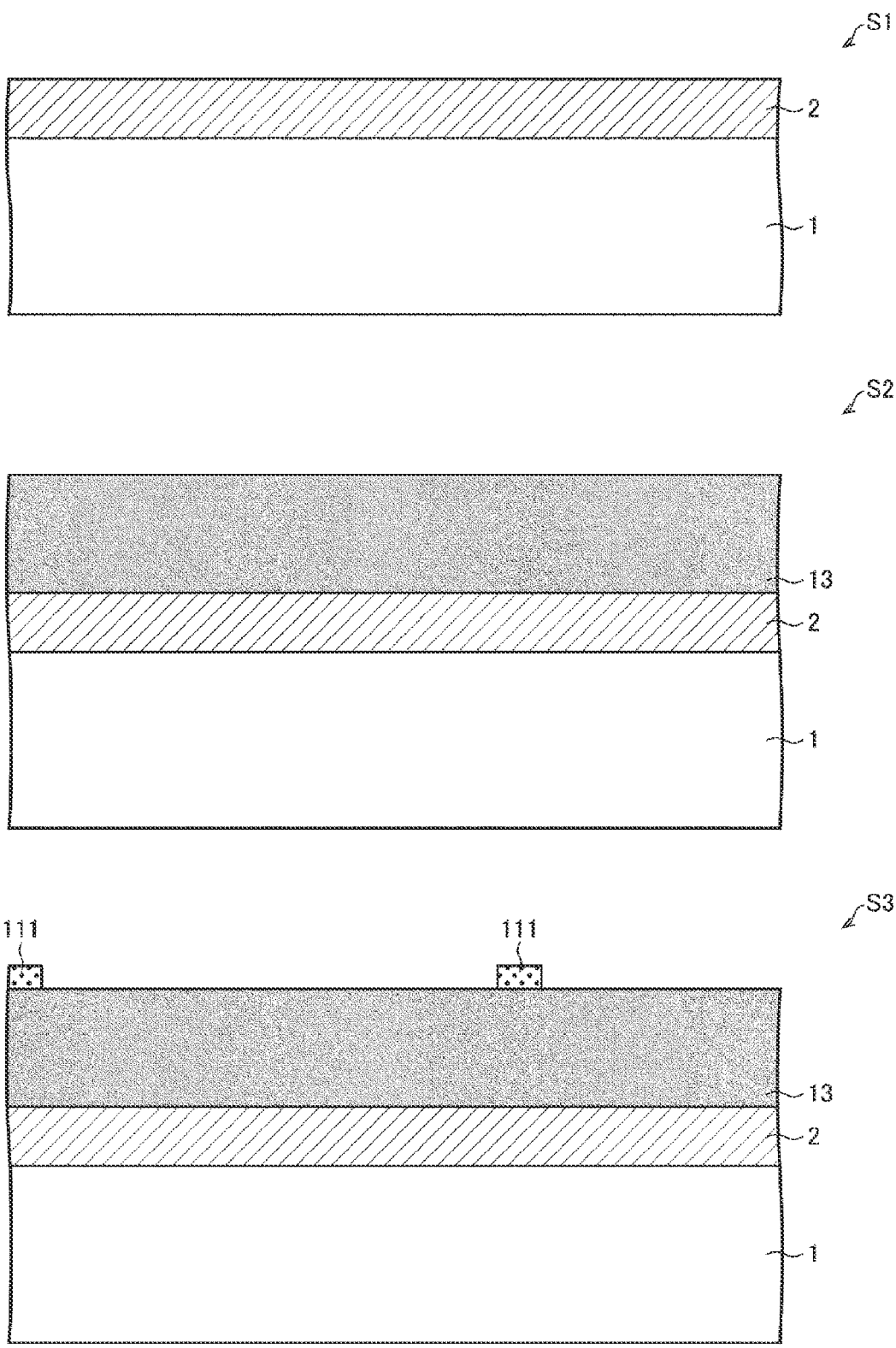
FIG. 4 is a cross-sectional view illustrating, in order, steps as part of manufacturing steps for a light-emitting element in the display device according to the first embodiment.

First of all, as illustrated in S1 in FIG. 4, the substrate 1 as a support body is prepared. Next, the AN 2 that comes into contact with the drain of the TFT (not illustrated) in the substrate 1 is formed in a solid form over the entire surface of the display region of the substrate 1 on the substrate 1 (step S1, first electrode forming step).

The substrate 1 may be prepared in advance by a known TFT step, or a commercially available array substrate may be used. The substrate 1 can be prepared, for example, by the following method. First of all, a TFT layer including a TFT and a plurality of wiring lines is formed on an insulating substrate by a known method. Next, a flattened layer made of photosensitive resin is formed on the TFT layer by a known method. Thereafter, a contact hole for connecting the AN 2 to the drain electrode of the TFT is formed in the flattened layer. As a result, the substrate 1 provided with a plurality of TFTs is formed.

For forming the AN 2, various known methods for forming an anode may be used, such as vapor deposition, sputtering, and heating after nanoparticle application. The AN 2 is connected to the drain electrode of the TFT through the contact hole formed in the flattened layer.

Next, as illustrated in S2 in FIG. 4, a hole transport material layer 13 made of a hole transport material to be the HTL 3 is formed, in a solid form, on the AN 2 (step S2).

For forming the hole transport material layer 13, sputtering, application and firing, nanoparticle application, and the like may be used. The hole transport material layer 13 is formed to have a layer thickness that is equal to or larger than the layer thickness of the EML 6.

Next, as illustrated in S3 in FIG. 4, a mask 111 is formed on the hole transport material layer 13 as an etching mask, to process the surface of the hole transport material layer 13 into a recessed and protruding form (step S3).

As the mask 111, a resist pattern may be formed with general photolithography, or instead of the resist pattern, a metal mask may be used to cover a region of the hole transport material layer 13 where the protruding portions 3a are formed.

After forming the mask 111, as illustrated in S4 in FIG. 5, the surface of the hole transport material layer 13 is etched by wet etching or dry etching, and thus the surface of the hole transport material layer 13 is processed into a recessed and protruding form. Then, the mask 111 is removed. As a result, the HTL 3 having the surface including the plurality of protruding portions 3a is formed (step S4).

Specifically, a region of the surface of the hole transport material layer 13, not covered by the mask 111 in plan view, is etched. As a result, a recessed portion having a remaining film thickness T1 is formed in the region not covered by the mask 111. Furthermore, the protruding portions 3a are formed in the region covered by the mask 111.

Here, the remaining film thickness T1 is a layer thickness of a portion of the HTL 3 other than the protruding portions 3a. The remaining film thickness T1 is preferably as thin as about 5 nm or greater and 20 nm or less. Preferably, the light absorption between the EML 6 and the AN 2, which is a lower layer light-reflective electrode, is small. The lower limit of the remaining film thickness T1 enabling the HTL 3 to remain as a continuous film is 5 nm, and the upper limit of the remaining film thickness T1 with no effect on light absorption is 20 nm. The film thickness of the HTL 3 is expressed as the sum of the remaining film thickness T1 and the height of the protruding portion 3a.

According to the present embodiment, with the first carrier transport layer forming step including step S2 to step S4 described above, the HTL 3 is formed to have the surface including the protruding portions 3a protruding toward the upper side.

Next, as illustrated in S5 in FIG. 5, an insulating film 14, to be the IL 4, is formed on the HTL 3 in a solid form to cover the protruding portions 3a (step S5).

For forming the insulating film 14, sputtering, chemical vapor deposition (CVD), and the like can be used, when the insulating film 14 is made of an inorganic insulating material. When the insulating film 14 is made of an organic insulating material such as resin, application and the like may be used.

Next, as illustrated in S6 in FIG. 5, an electron transport material layer 15, to be the ETL 5, is formed between the protruding portions 3a covered by the insulating film 14, to have the upper surface of the electron transport material layer 15 being at the same height as the upper surface of the protruding portions 3a (step S6).

For forming the electron transport material layer 15, a method that is the same as that for forming the hole transport material layer 13, such as sputtering, application and firing, and nanoparticle application can be used.

Next, as illustrated in S7 in FIG. 6, a mask 112 is formed, on the electron transport material layer 15, as an etching mask for patterning and forming the ETL 5 having the shape illustrated in FIG. 1 and FIG. 2 (step S7).

As the mask 112, a resist pattern may be formed with general photolithography, or instead of the resist pattern, a metal mask may be used to cover the pattern forming region of the ETL 5.

Next, as illustrated in S8 in FIG. 6, a portion of the electron transport material layer 15 not covered by the mask 112 is removed by wet etching or dry etching. The mask 112 is then removed. As a result, the ETL 5 of an island shape having a desired pattern is formed (step S8).

According to the present embodiment, with the second carrier transport layer forming step including step S6 to step S8 described above, the ETL 5 is formed in an island shape while being separated from the HTL 3. In addition, according to the present embodiment, by performing steps S6 to S8 described above after step S5, the ETL 5 is finally formed on the HTL 3 with the IL 4 provided in between.

Next, as illustrated in S9 in FIG. 6, a mask 113 is formed as an etching mask, on the ETL 5, for patterning the insulating film 14 in accordance with the shape of the ETL 5 (step S9).

As the mask 113, a resist pattern may be formed with general photolithography, or instead of the resist pattern, a metal mask may be used to cover the upper surface of the ETL 5.

Next, as illustrated in S10 in FIG. 7, a portion of the insulating film 14 not covered by the mask 113 and not covered by the ETL 5 is removed by etching or ashing.

The mask 113 is then removed. As a result, the island shaped IL 4 having a shape geometrically similar to the ETL 5 is patterned and formed. Next, as illustrated in FIG. 1, the bank BK having a height equal to or higher than the upper surface of the protruding portion 3*a* and the upper surface of the ETL 5 is formed. As a result, in each pixel P, the recessed portion CP surrounded by the HTL 3, the IL 4, the ETL 5, and the banks BK is formed. Thereafter, as illustrated in FIG. 1, the CA 7 is formed on the ETL 5 (step S10).

According to the present embodiment, after step S5, the etching or ashing of the insulating film 14 and the removal of the mask 113 are performed in step S9 and step S10, whereby the IL 4 is formed as described above (insulating layer forming step).

Note that, in the present embodiment, as described above, an example is described in which the CA 7 is formed (second electrode forming step), after the banks BK are formed (bank forming step). However, the order of the formation of the CA 7 (second electrode forming step) and the formation of the banks BK (bank forming step) may be reversed.

The banks BK can be formed by bank material application and photolithography for example.

The CA 7 can be formed by a manner that is same as that for the HTL 3, the IL 4, the ETL 5, and the like. Specifically, after a conductive layer to be the CA 7 is formed, and after the etching mask is formed on the conductive layer and the conductive layer is etched by wet etching or dry etching, the mask may be removed. Of course, the CA 7 may be formed by printing, vapor deposition, CVD, or the like. Various known methods for forming a cathode, such as vapor deposition and sputtering, can be used for forming the conductive layer. In this manner, the light-emitting element 10 according to the present embodiment is manufactured.

For S8 and S9 in FIG. 6, an example where the mask 113 is formed after the mask 112 has been removed is illustrated. However, depending on the type of and etching method for the mask 112, the mask 112 may remain without being removed, to be used for patterning the IL 4.

Next, as illustrated in S11 in FIG. 7, the EML 6 is formed in the recessed portion CP, which is a space portion between the HTL 3 and the ETL 5 in plan view (step S11, light-emitting layer forming step).

The EML 6 can be formed by filling the recessed portion CP with a light-emitting material by, for example, ink-jet application. When the EML 6 is a QD layer including QDs, the EML 6 can be formed by a method such as ink-jet application on the recessed portion CP using a colloidal solution in which the QDs are dispersed. In this process, the formation condition such as the layer thickness of the EML 6 is adjusted to make the height of upper surface of the EML 6 lower than the heights of the upper surface of the protruding portion 3*a* and the upper surface of the ETL 5.

According to the present embodiment, the EML 6 can be thus formed in the final step, whereby the light-emitting element 10 can be manufactured with no process damage on the EML 6.

The display device 100 is manufactured by sealing the light-emitting element 10 with the sealing resin 21 and the sealing substrate 22, after step S12 described above.

Effect

As described above, the light-emitting element 10 according to the present embodiment includes the AN 2, the HTL 3, the CA 7, the ETL 5, and the EML 6, at least part of the EML 6 overlaps on part of the HTL 3, and part of the EML 6 overlaps on part of the ETL 5. The HTL 3 and the ETL 5 face each other with the EML 6 provided in between, in plan view.

According to the light-emitting element 10 described above, the carrier injection and the light extraction are performed in different directions. As described above, in plan view, the light-emitting element 10 has the HTL 3 and the ETL 5 facing each other with the EML 6 provided in between. Thus, a carrier can be injected to the EML 6 in the lateral direction in cross-sectional view, which is the in-plane direction thereof, and the light can be extracted in the vertical direction in cross-sectional view (specifically, upward direction), which is a direction crossing the lateral direction described above. Thus, the carrier injection and light extraction can each be independently designed optimally. An optimal manufacturing process can be employed for each of the manufacturing of the HTL 3 and the ETL 5, and the manufacturing of the AN 2 and the CA 7.

As described above, the EML 6 is provided on part of the HTL 3 and part of the ETL 5. Therefore, the EML 6 is formed in a process after those for the HTL 3 and the ETL 5. The EML 6 is positioned to be an upper layer relative to the HTL 3 and the ETL 5, and no electrode or carrier transport layer is on the upper surface of the EML 6 (that is on the light extraction path) as a light extraction surface of the EML 6. Thus, the light-emitting element 10 does not require a transparent material to be used for one of the pair of electrodes and one of the pair of carrier transport layers as in known light-emitting elements, and thus features a higher degree of freedom in terms of selection of the materials of the electrodes and the carrier transport layer compared with known cases.

For the AN 2, the CA 7, the HTL 3, and the ETL 5, a favorable conductive material with no optical limitation can be used, for improving the light extraction efficiency and improving electrical characteristics. Thus, with the present embodiment, improvement in light extraction efficiency and improvement in electrical characteristics can both be achieved.

Thus, the light-emitting element 10 is not affected by light absorption or by a difference in refractive index caused by the electrodes and the carrier transport layer provided on the light extraction path of the EML 6, as in the known light-emitting elements.

Thus, the present embodiment can provide the light-emitting element 10, the display device 100, and the manufacturing method for the light-emitting element 10 featuring a higher degree of freedom in terms of selection in the materials of the electrodes and the carrier transport layer than in known cases, and enabling improvement in the light extraction efficiency.

As described above, the light-emitting element 10 has no electrode or other layers such as carrier transport layer on the light extraction path of the EML 6. Thus, according to the present embodiment, the process damage of the EML 6 can be reduced compared with that in known light-emitting elements.

Figure 8:
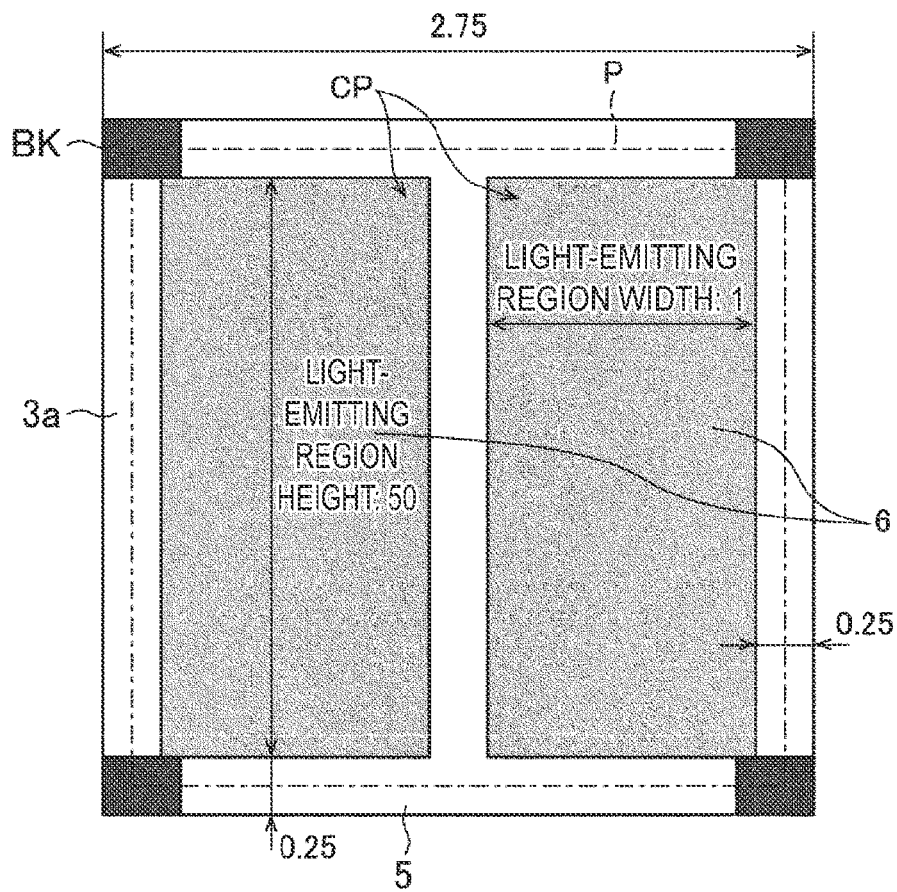
FIG. 8 is a plan view illustrating a relationship between a pixel and a light-emitting region of the display device according to the first embodiment.
Figure 9:
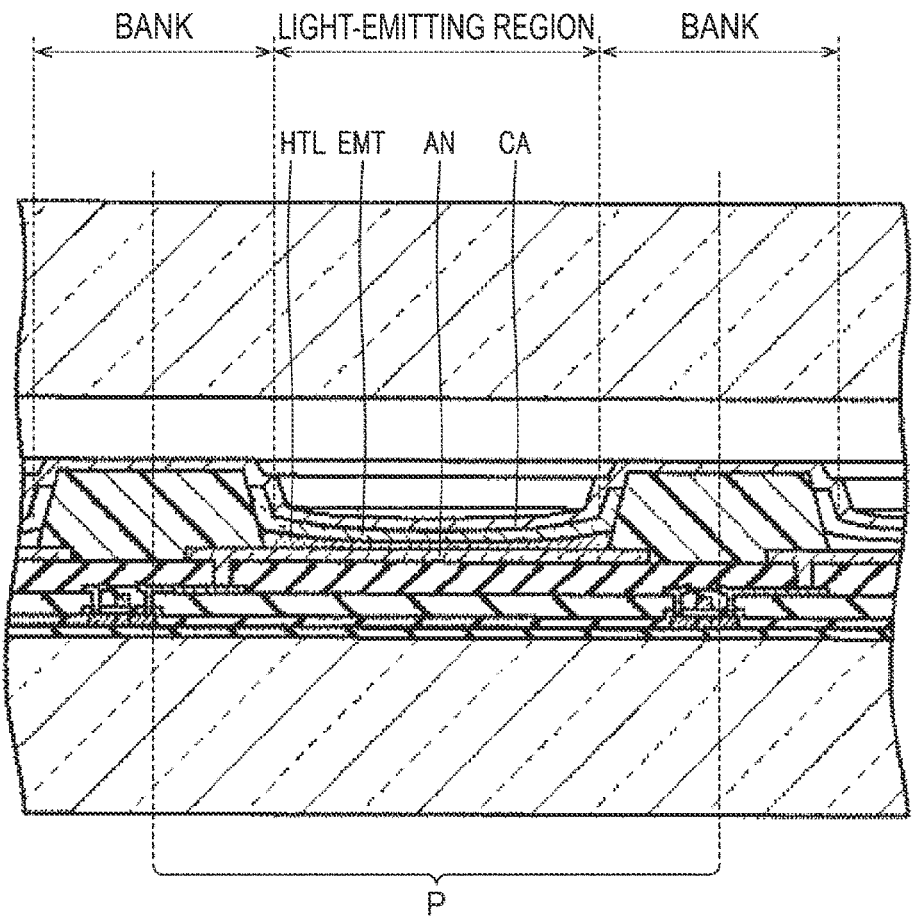
FIG. 9 is a cross-sectional view illustrating a schematic configuration of main portions of a display device described in PTL 1.
Figure 10:
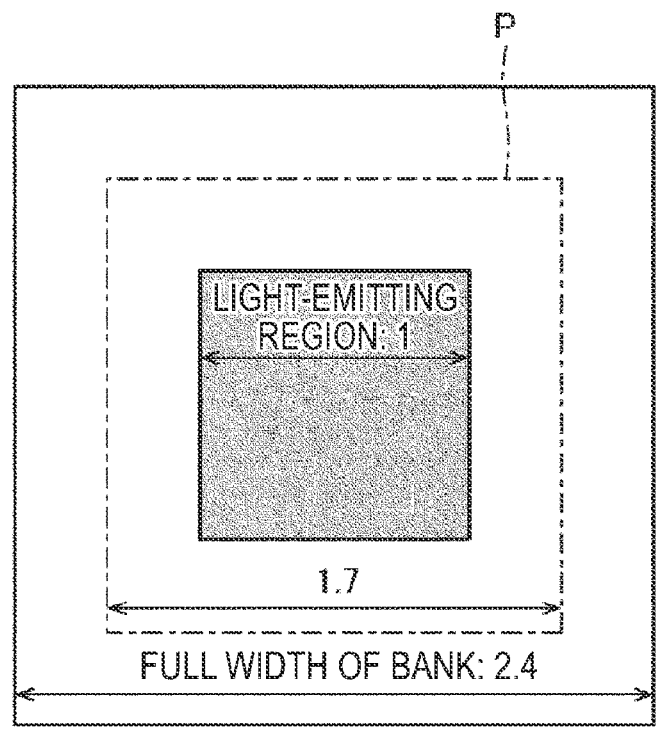
FIG. 10 is a plan view illustrating a relationship between the pixel and the light-emitting region of the display device illustrated in FIG. 9.

FIG. 8 is a plan view illustrating a relationship between the pixel P and a light-emitting region of the display device 100 according to the present embodiment. FIG. 9 is a cross-sectional view illustrating a schematic configuration of main portions of a display device described in PTL 1. FIG. 10 is a plan view illustrating a relationship between the pixel P and the light-emitting region of the display device illustrated in FIG. 9.

As illustrated in FIG. 2 and FIG. 8, the display device 100 according to the present embodiment only requires slight banks BK at the four corners of the pixel P. The line width of the protruding portion 3a and the line width of the ETL 5 vary based on the line width of the photolithography and the etching selection ratio, and can be controlled by a certain level. The line width of the protruding portion 3a and the line width of the ETL 5 obtained after the etching of the HTL 3 and the ETL 5 are values as a result of multiplication by the selection ratio of the exposure line width.

When the selection ratio is assumed to be 0.5, a pixel effective area rate EA1 of the display device 100 illustrated in FIG. 8 is EA1=(1×50)×2/(50.25×2.5)≈0.80. Note that the pixel effective area is expressed by the area of the light-emitting region relative to the area of the pixel P.

On the other hand, as illustrated in FIG. 9 and FIG. 10, a pixel effective area rate EA2 of the known display device (PTL 1) EA2=1×1/(1.7×1.7)≈0.35.

Accordingly, with the present embodiment, the pixel effective area rate can be improved compared with that in the known display device, and a higher aperture ratio than that in the known display device can be achieved.

Figure 11:
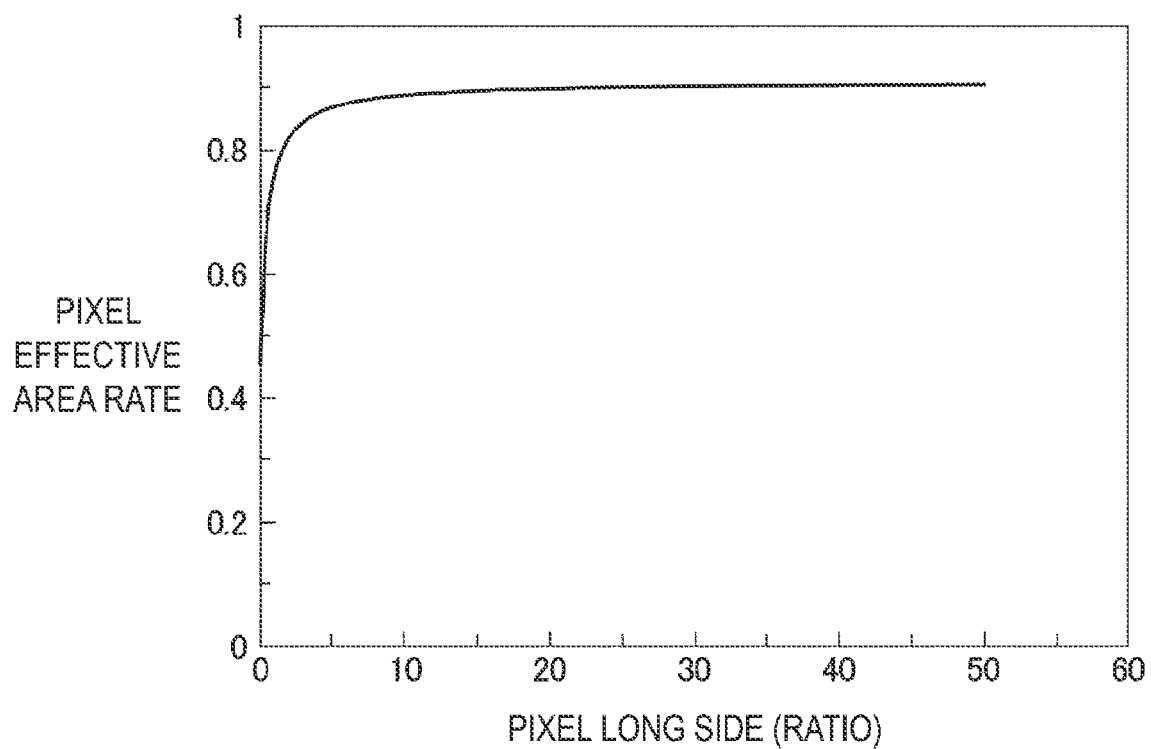
FIG. 11 is a graph showing a relationship between a ratio of the long side size of the pixel to the short side size of the pixel in the display device according to the first embodiment and a pixel effective area rate.

The pixel effective area rate is determined by the long side size of the pixel P (the size of the pixel P illustrated in FIG. 8 in the vertical direction). FIG. 11 is a graph showing a relationship between a ratio of the long side size of the pixel P to the short side size of the pixel P (the size of the pixel P illustrated in FIG. 8 in the lateral direction) in the display device 100 according to the present embodiment and a pixel effective area rate. FIG. 11 shows the pixel effective area rate obtained with the ratio of the long side size of the pixel P to the short side size of the pixel P changed from 0.5 to 50. As shown in FIG. 11, by setting the ratio of the long side size of the pixel P to the short side size of the pixel P to be equal to or larger than 10, a pixel effective area rate close to 0.9 (i.e., 90%) can be obtained.

Note that the pixel effective area rate equivalent to that in the known display device can be obtained in a state close to a square, with the ratio of the long side size of the pixel P to the short side size of the pixel P being equal to or less than 1. In the known display device, one carrier transport layer and one electrode are on the light extraction surface side on the upper side of the EML, and thus the transmittance of the carrier transport layer and the electrode on the light extraction surface side needs to be taken into consideration.

On the other hand, according to the present embodiment, as described above, a favorable conductive material free of optical limitation can be used for any of the carrier transport layer and the electrode, whereby the improvement in the light extraction efficiency and the improvement in the electrical characteristics can both be achieved. Note that, the transmittance obtained with Al, Mg, ZnO, ITO, InGaZnOx, or the like assumed to be used for the carrier transport layer and the electrode is 80% to 90%. Meanwhile, in the light-emitting element 10 of the present embodiment, no other layer exists on the upper side of the EML 6, meaning that the light absorption by the carrier transport layer and the electrode on the upper side of the EML 6 does not need to be taken into consideration as in the known display device.

Modified Example 1

Figure 12:
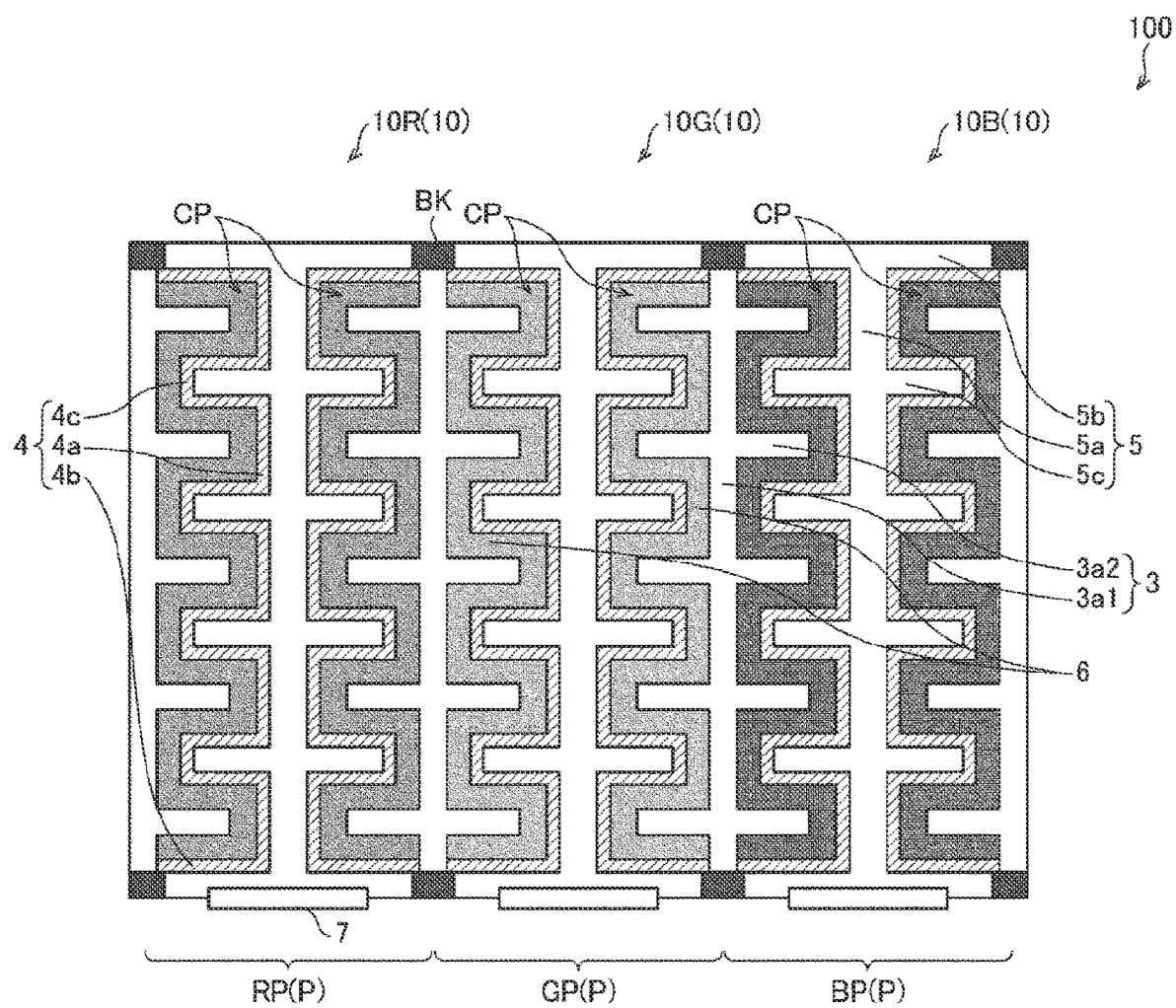
FIG. 12 is a perspective view illustrating a schematic configuration of main portions of a display device according to Modified Example 1 of the first embodiment as viewed from the upper side.

FIG. 12 is a perspective view illustrating a schematic configuration of main portions of the display device 100 according to the present modified example as viewed from the upper side.

As illustrated in FIG. 12, the ETL 5 according to the present modified example has a fishbone shape in plan view. More specifically, the ETL 5 includes: the vertical line portion 5a; the lateral line portions 5b; and a plurality of branch line portions 5c that are positioned between the lateral line portions 5b and protrude in directions crossing the vertical line portion 5a in each recessed portion CP to form a comb teeth shape in plan view. Accordingly, the IL 4 according to the present modified example includes: the vertical line portion 4a; the lateral line portions 4b; and a plurality of branch line portions 4c that are positioned between the lateral line portions 4b and protrude in directions crossing the vertical line portion 4a in each recessed portion CP to form a comb teeth shape, and thus also has a fishbone shape in plan view.

The protruding portion 3a according to the present modified example includes: a vertical line portion 3a1 serving as the main line portion extending in the vertical direction to be in parallel with the vertical line portion 5a; and a plurality of branch line portions 3a2 protruding in directions crossing the vertical line portion 3a1 in each recessed portion CP to form a comb teeth shape, and thus has a fishbone shape in plan view.

In the present modified example, the branch line portion 5c and the branch line portion 3a2 are provided to extend in parallel with the lateral line portion 5b. The ETL 5 and the protruding portion 3a are formed in a comb shape in each recessed portion CP in plan view, and the branch line portions 5c and the branch line portions 3a2 serving as their comb teeth portions are alternately arranged to interdigitate with each other. With the recesses and protrusions thus provided to the HTL 3 and the ETL 5, serving as the side walls of the recessed portion CP, in plan view, the carrier injection area is increased, whereby the carrier injection with the HTL 3 and the ETL 5 can be facilitated. Furthermore, the aspect ratio of EML 6 can be substantially reduced.

Note that the branch line portions 5c and the branch line portions 3a2 adjacent to each other may be arranged to face each other in the extending directions of the branch line portions 5c and the branch line portions 3a2, and thus do not necessarily need to be alternately arranged side by side. The branch line portions 5c and the branch line portions 3a2 may not necessarily be parallel to the lateral line portions 5b.

Modified Example 2

Figure 13:
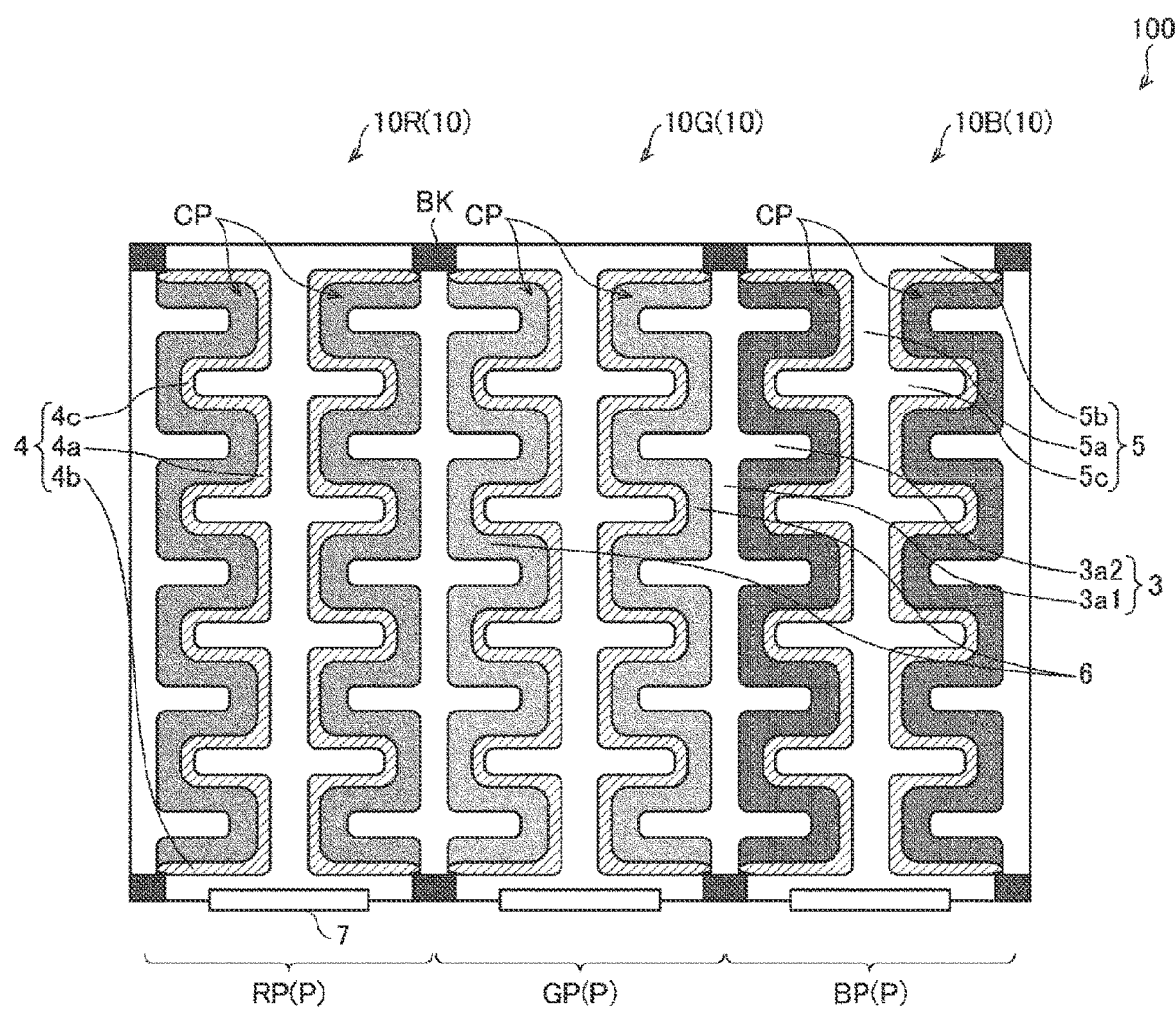
FIG. 13 is a perspective view illustrating a schematic configuration of main portions of a display device according to Modified Example 2 of the first embodiment as viewed from the upper side.

FIG. 13 is a perspective view illustrating a schematic configuration of main portions of the display device 100 according to the present modified example as viewed from the upper side.

As illustrated in FIG. 13, for example, the protruding portion 3a, the IL 4, and the ETL 5 preferably have a curved corner portion in plan view. In other words, in plan view, the protruding portion 3a, the IL 4, and the ETL 5 preferably have shapes without corners defined by straight lines connected to each other. With this configuration, local electrical field concentration at the corner portions of the protruding portion 3a, the IL 4, and the ETL 5 can be avoided.

Note that, in FIG. 13, as an example, the protruding portion 3a, the IL 4, and the ETL 5 illustrated in FIG. 12 having curved corner portions in plan view are illustrated, but the present embodiment is not limited thereto. For example, the ETL 5 and the IL 4 illustrated in FIG. 1 may have the curved corner portions in plan view. Of course, in the example illustrated in FIG. 1 and FIG. 2, when the lower electrode is the CA 7, the HTL 3 may have a curved corner portion in plan view.

Modified Example 3

Figure 14:
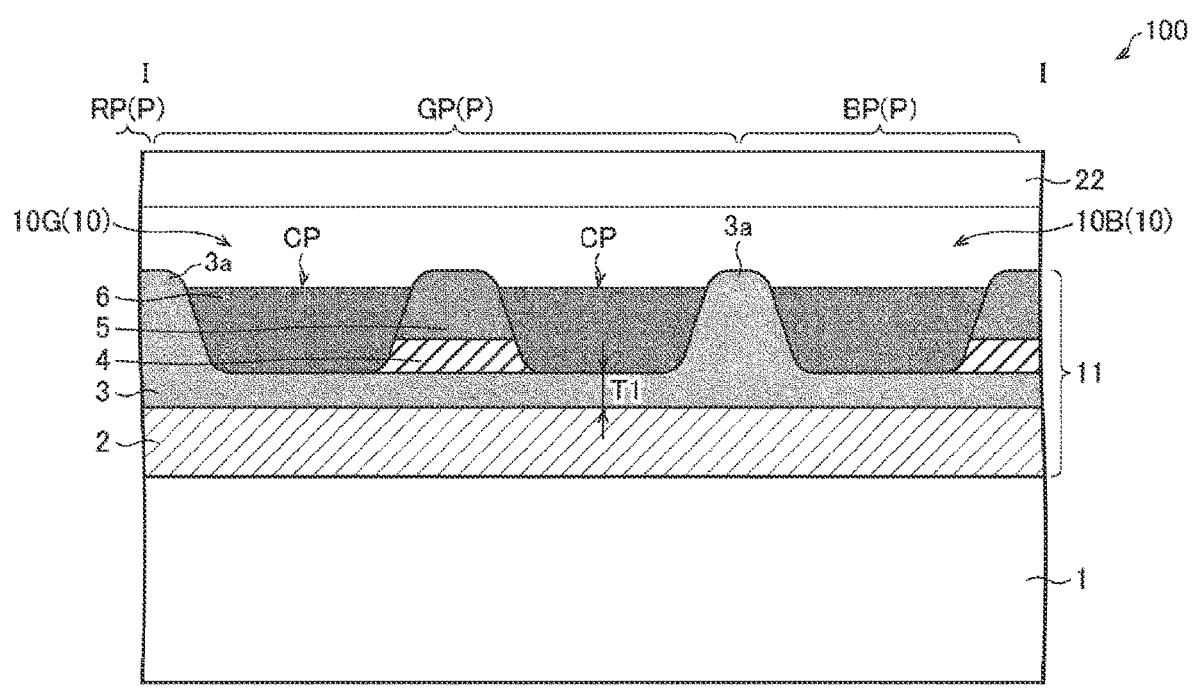
FIG. 14 is another cross-sectional view illustrating a schematic configuration of main portions of the display device illustrated in FIG. 1 taken along line I-I in FIG. 1.

FIG. 14 is another cross-sectional view illustrating a schematic configuration of main portions of the display device 100 illustrated in FIG. 1 taken along line I-I in FIG. 1.

As illustrated in FIG. 14, the protruding portion 3a, the IL 4, and the ETL 5 preferably have a curved cross-sectional shape. In other words, in cross-sectional view, the protruding portion 3a, the IL 4, and the ETL 5 preferably have shapes with curved corner portions in a wavy form, without corners defined by straight lines connected to each other. With this configuration, local electrical field concentration at the corner portions of the protruding portion 3a, the IL 4, and the ETL 5 can be avoided.

A method of forming the protruding portion 3a, the IL 4, and the ETL 5 to have the corner portion with a wavy form is not particularly limited. For example, due to interference of the light by the half exposure and a resolution of an exposure device, the protruding portion 3a, the IL 4, and the ETL 5 having a protruding structure including a gentle end face with an inclination angle can be formed.

Other Modified Examples

As described above, in FIG. 3, a glass substrate (sealing glass) is used as the sealing substrate 22 for example. By bonding the substrate 1 and the sealing substrate 22 with the sealing resin 21 provided in between, the light-emitting element 10 is provided with glass sealing (what is known as can sealing with no organic sealing film or inorganic sealing film). However, the method of sealing the light-emitting element 10 is not limited to the method described above. For example, the light-emitting element 10 may be provided with the can sealing, by using sealing substrate (sealing glass) made of frame-shaped glass, obtained by forming frit glass (granulated glass) into a frame shape, instead of using the sealing resin 21 and the sealing substrate 22. Furthermore, as the sealing layer, an organic sealing layer may be formed by an ink-jet method or an inorganic sealing film formed by a nitride film may be formed by using a CVD, on the upper surface of the light-emitting element 10 for example.

When the film is formed on the EML 6, the EML 6 might be damaged, and the light-emission characteristics might be negatively affected.

Thus, of the sealing methods described above, the can sealing for the light-emitting element 10 using the sealing substrate 22 described above or the frame-shaped glass is particularly preferable. With this configuration, the light-emitting element 10 can be protected, with no process damage on the EML 6.

In addition, with reference to FIG. 2, an example is described where the AN 2 is the lower electrode and the CA 7 is the upper electrode. However, the disclosure is not limited to this, and the CA 7 may be the lower electrode, and the AN 2 may be the upper electrode. In this case, the CA 7 may be a reflective electrode.

With the AN 2, the HTL 3, the IL 4, the ETL 5, and the CA 7 arranged to make one of the HTL 3 and the ETL 5 with which the carrier injection is more difficult provided on the lower side, a distribution of the electrical field applied to the EML 6 can be expanded, whereby the carrier injection can be more facilitated.

In the present embodiment, the display device 100 is described as an example of a light-emitting device (electronic device) including the light-emitting element 10. However, the light-emitting element 10 can be suitably used in a light-emitting device other than the display device 100, such as an illumination device.

Second Embodiment

Differences from the first embodiment will be described in the present embodiment. Note that, for convenience of description, components having the same function as the components described in the first embodiment are designated by the same reference numbers, and descriptions thereof are omitted.

Figure 15:
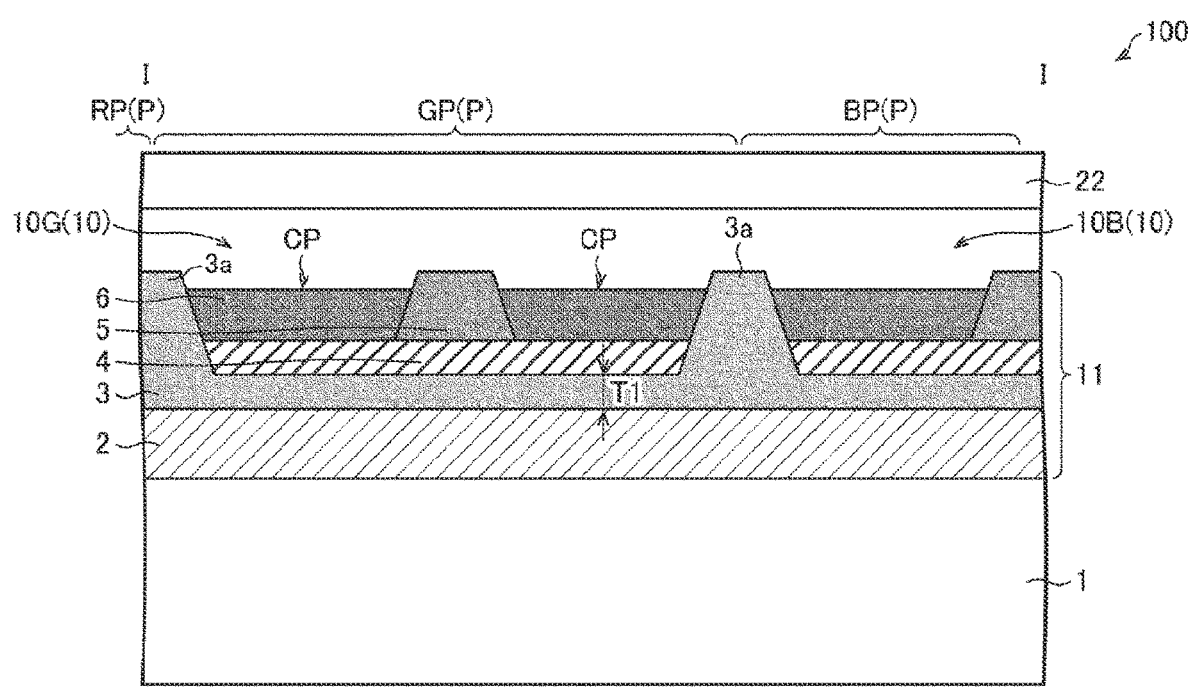
FIG. 15 is another cross-sectional view illustrating a schematic configuration of main portions of a display device according to a second embodiment.

FIG. 15 is another cross-sectional view illustrating a schematic configuration of main portions of the display device 100 according to the present embodiment. The perspective view illustrating a schematic configuration of main portions of the display device 100 according to the present embodiment as viewed from the upper side is the same as FIG. 1. Thus, FIG. 15 corresponds to another cross-sectional view illustrating a schematic configuration of main portions of the display device 100 illustrated in FIG. 1 taken along line I-I in FIG. 1.

The light-emitting element 10 and the display device 100 according to the present embodiment respectively have the same configuration as the light-emitting element 10 and the display device 100 according to the first embodiment, except for the following points. As illustrated in FIG. 15, the light-emitting element 10 and the display device 100 according to the present embodiment have the IL 4 formed, on the HTL 3, in an island shape to cover the entirety of the bottom surface of the recessed portion CP. Thus, in the light-emitting element 10 and the display device 100 according to the present embodiment, the bottom surface of the recessed portion CP is formed by the IL 4.

As in the first embodiment, in the present embodiment, the EML 6 is formed to have the height of the upper surface of the EML 6 being lower than the heights of the upper surface of the HTL 3 and the upper surface of the ETL 5. Note that in the present embodiment, the depth of the recessed portion CP surrounded by the HTL 3, the IL 4, the ETL 5, and the banks BK is smaller than that in the light-emitting element 10 and the display device 100 according to the first embodiment, by a depth corresponding to the layer thickness of the IL 4. In the present embodiment, the depth of the recessed portion CP is equal to the layer thickness of the ETL 5. Thus, in the present embodiment, the ETL 5 and EML 6 are formed to make the layer thickness of the ETL 5 larger than the layer thickness of the EML 6.

Figure 16:
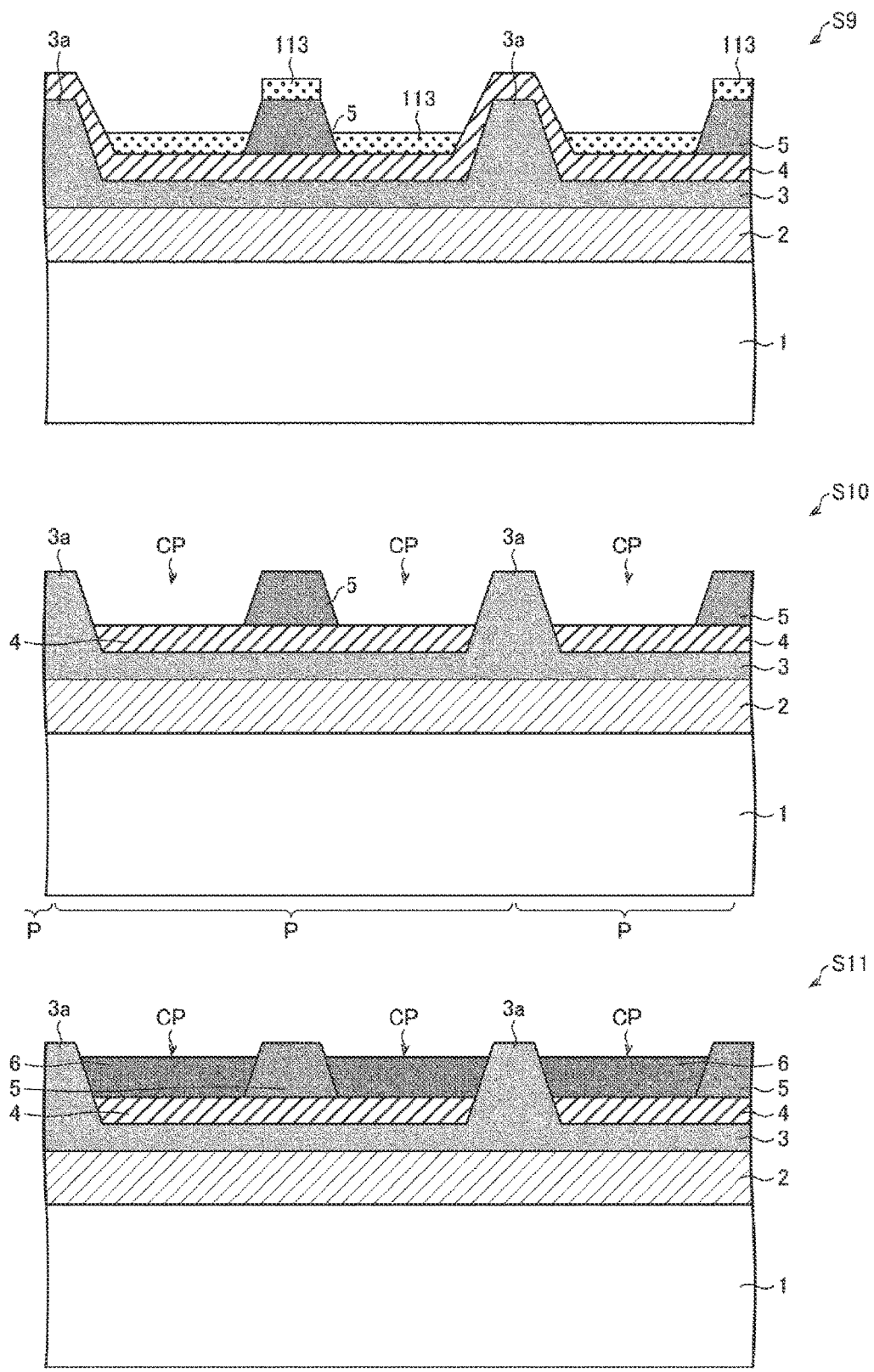
FIG. 16 is a cross-sectional view illustrating, in order, steps as part of manufacturing steps for a light-emitting element in the display device according to the second embodiment.

Next, a manufacturing method for the light-emitting element 10 and the display device 100 according to the present embodiment will be described. FIG. 16 is a cross-sectional view illustrating, in order, steps as part of manufacturing steps for the light-emitting element 10 in the display device 100 according to the present embodiment. Note that FIG. 16 illustrate a cross section of the display device 100 corresponding to the cross section of the light-emitting element 10 illustrated in FIG. 15. FIG. 16 illustrates a manufacturing step after the manufacturing step in S8 in FIG. 6.

In the present embodiment, after steps S1 to S8 are performed as in the first embodiment, as illustrated in S9 in FIG. 16, the mask 113 is formed on the ETL 5 and between the protruding portions 3a covered by the insulating film 14 and the ETL 5, as step S9.

Next, as illustrated in S10 in FIG. 16, a portion of the insulating film 14 not covered by the mask 113 and not covered by the ETL 5 is removed by etching or ashing, as step S10. The mask 113 is then removed. As a result, the IL 4 is patterned to be an island shape to cover the entire bottom surface of the recessed portion CP. Next, as illustrated in FIG. 1, the bank BK having a height equal to or higher than the upper surface of the protruding portion 3a and the upper surface of the ETL 5 is formed, as in the first embodiment. As a result, in each pixel P, the recessed portion CP surrounded by the HTL 3, the IL 4, the ETL 5, and the banks BK is formed. Thereafter, as illustrated in FIG. 1, the CA 7 is formed on the ETL 5, as in the first embodiment (step S10).

Next, as illustrated in S11 in FIG. 16, the EML 6 is formed in the recessed portion CP as in the first embodiment (step S11, light-emitting layer forming step). In this process, also in the present embodiment, the formation condition such as the layer thickness of the EML 6 is adjusted to make the height of upper surface of the EML 6 lower than the heights of the upper surface of the protruding portion 3a and the upper surface of the ETL 5.

Then, as in the first embodiment, the light-emitting element 10 is sealed, whereby the display device 100 is manufactured.

In the light-emitting element 10 according to the first embodiment, the IL 4, serving as the insulating layer, is provided only immediately below the ETL 5. Thus, electrical field may be concentrated around the IL 4 where the ETL 5 and the HTL 3 are arranged close to each other, and this may result in local light emission.

On the other hand, in the present embodiment, since the bottom surface of the recessed portion CP is formed by the IL 4, electrical field concentration at only a portion around the IL 4 does not occur, and the current flows in a direction parallel to the surface of the substrate 1. Thus, according to the present embodiment, the light from the light-emitting element 10 can be uniformly emitted in planar direction.

Third Embodiment

Differences from the first and the second embodiments will be described in the present embodiment. Note that, for convenience of description, components having the same function as the components described in the first and the second embodiments are designated by the same reference numbers, and descriptions thereof are omitted.

Figure 17:
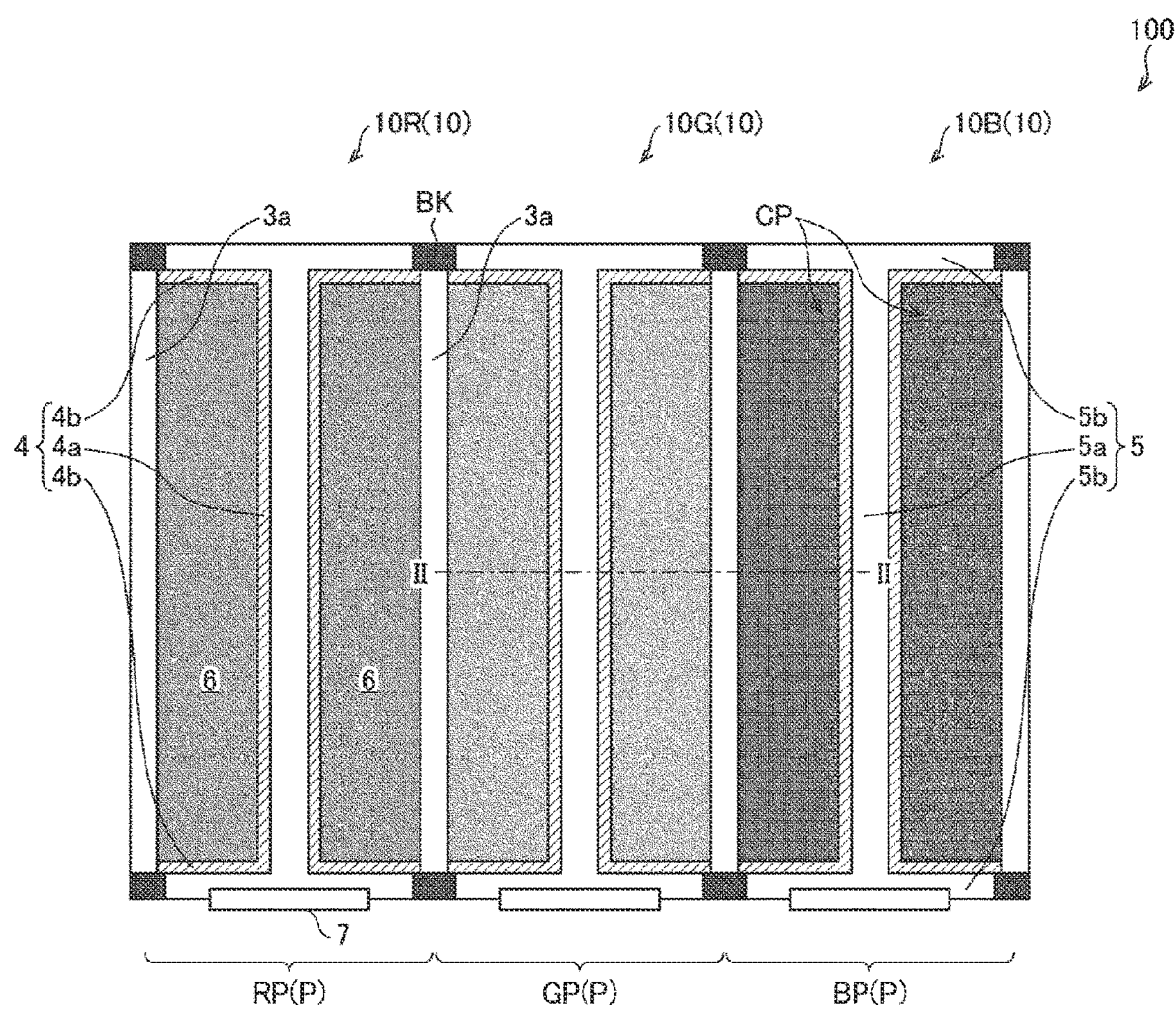
FIG. 17 is a perspective view illustrating a schematic configuration of main portions of a display device according to a third embodiment as viewed from the upper side.
Figure 18:
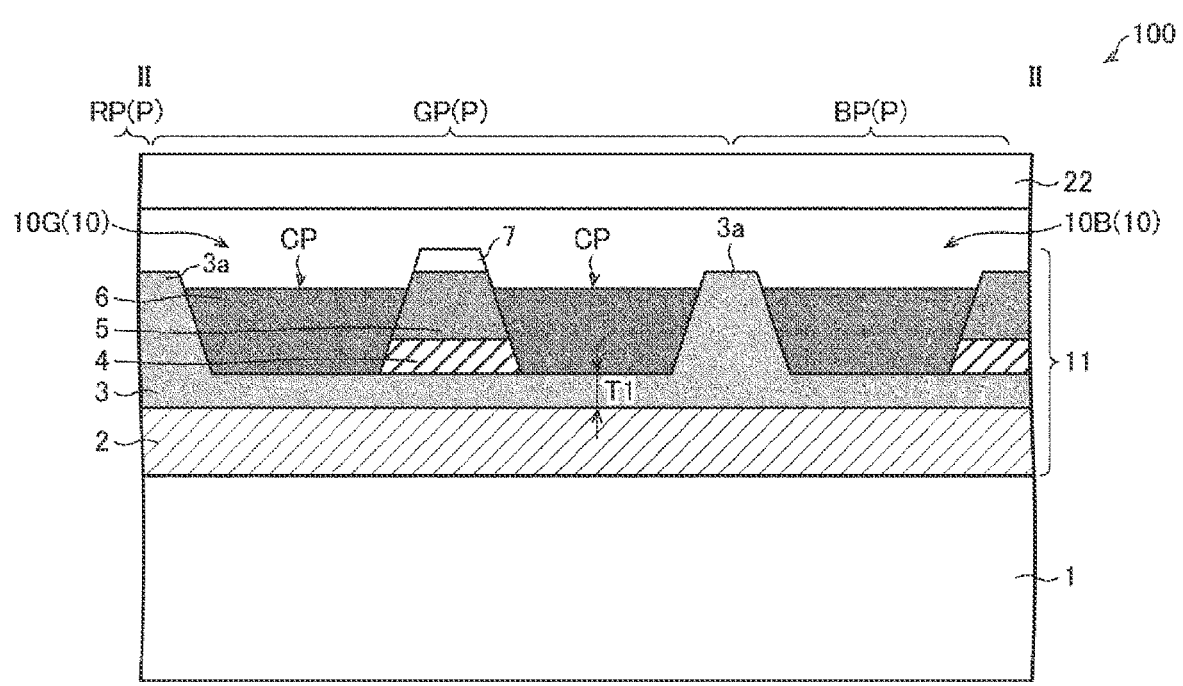
FIG. 18 is a cross-sectional view illustrating a schematic configuration of main portions of the display device illustrated in FIG. 17 taken along line II-II in FIG. 17.

FIG. 17 is a perspective view illustrating a schematic configuration of main portions of the display device 100 according to the present embodiment as viewed from the upper side. FIG. 18 is a cross-sectional view illustrating a schematic configuration of main portions of the display device 100 illustrated in FIG. 17 taken along line II-II in FIG. 17. Note that in FIG. 17, an upper surface of the display device 100 as seen through the sealing substrate 22 is illustrated.

The light-emitting element 10 and the display device 100 according to the present embodiment respectively have the same configuration as the light-emitting element 10 and the display device 100 according to the first embodiment, except for the following points. As illustrated in FIG. 17 and FIG. 18, the light-emitting element 10 and the display device 100 according to the present embodiment has the CA 7 formed to overlap with the ETL 5 while having the lower surface being of the same shape as the upper surface of the ETL 5. Thus, the CA 7 has a shape geometrically similar to those of the ETL 5 and the IL 4.

FIG. 17 illustrates an example where the CA 7, the ETL 5, and the IL 4 are formed in an I shape in plan view for example. However, the shapes of the CA 7, the ETL 5, and the IL 4 in plan view are not limited to the shape described above. It is a matter of course that the CA 7, the ETL 5, and the IL 4 can have the shapes that are the same as those of the ETL 5 and the IL 4 illustrated in FIG. 12 or FIG. 13 in plan view.

Figure 19:
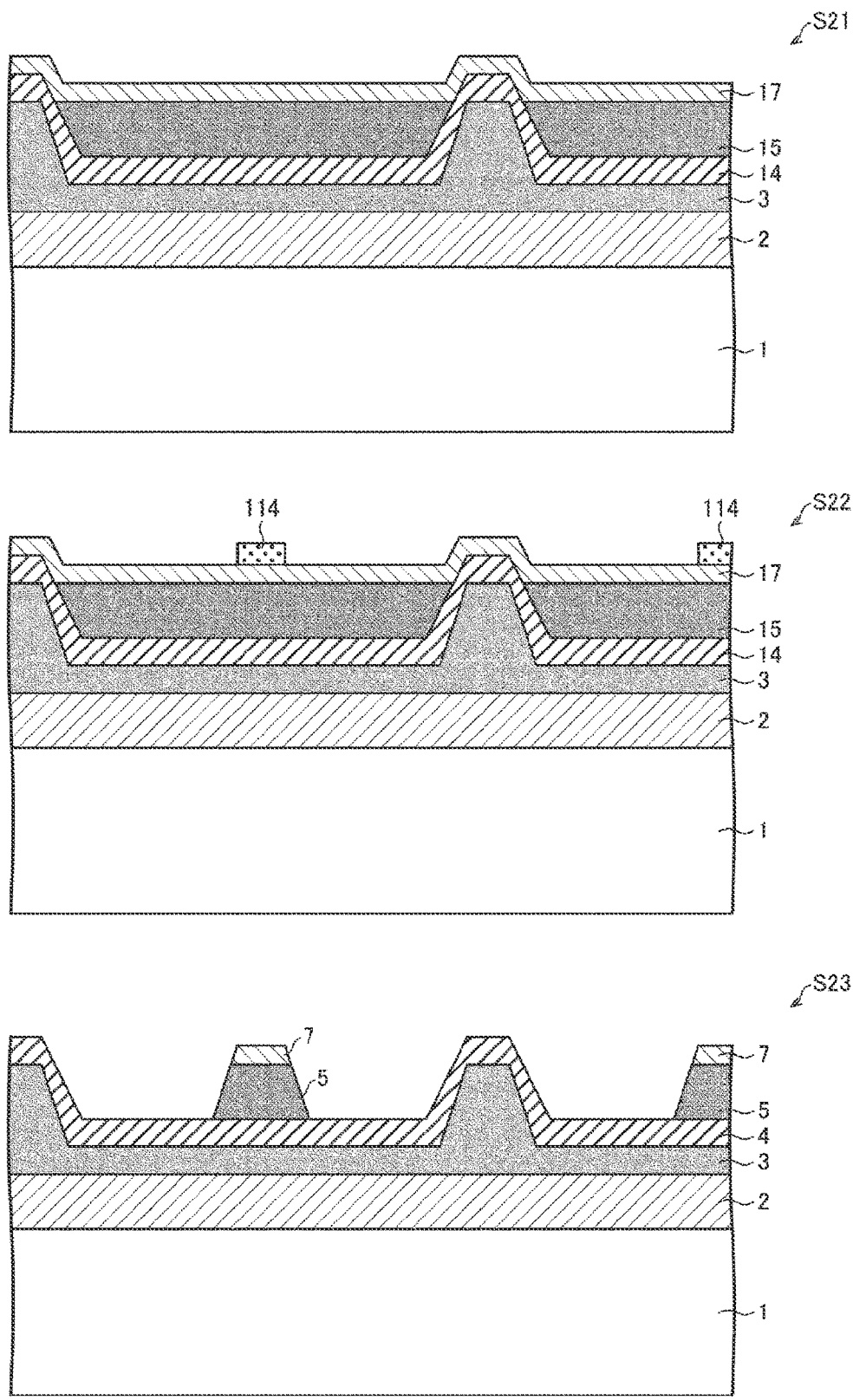
FIG. 19 is a cross-sectional view illustrating, in order, steps as part of manufacturing steps for a light-emitting element in the display device according to the third embodiment.
Figure 20:
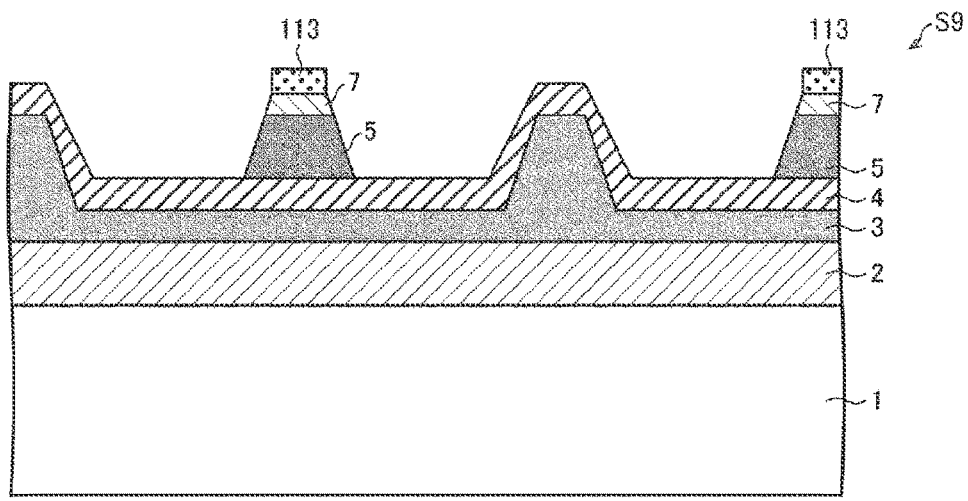
FIG. 20 is another cross-sectional view illustrating, in order, steps as part of manufacturing steps for the light-emitting element in the display device according to the third embodiment.
Figure 20:
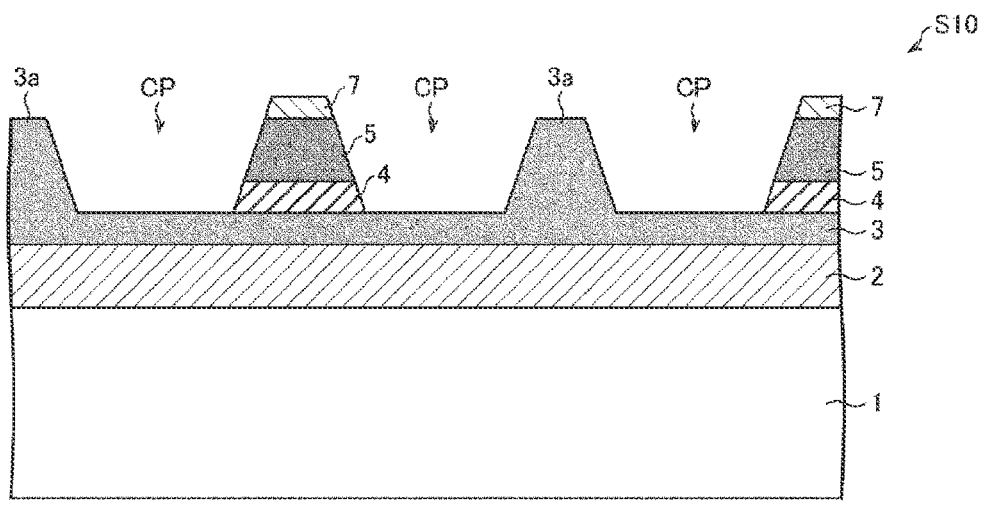
Figure 20:
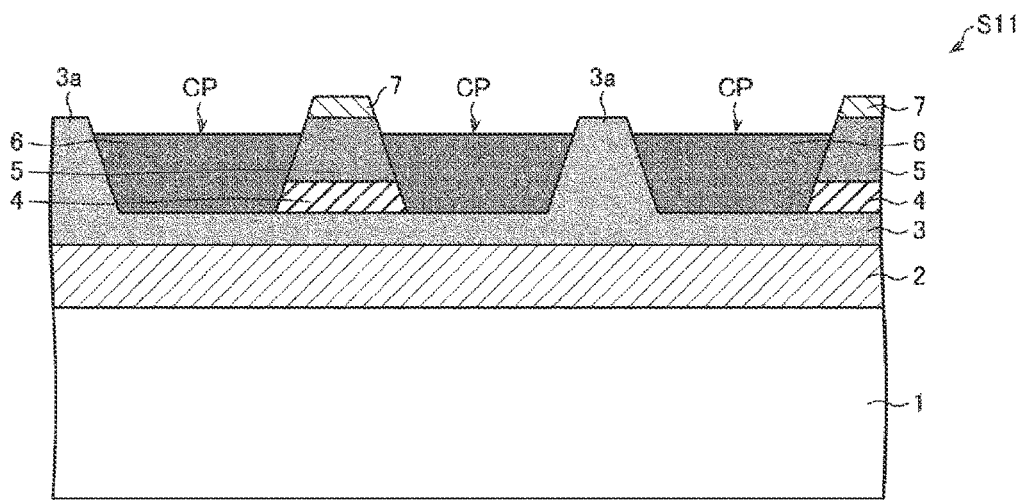

Next, a manufacturing method for the light-emitting element 10 and the display device 100 according to the present embodiment will be described. FIG. 19 and FIG. 20 is a cross-sectional view illustrating, in order, steps as part of manufacturing steps for the light-emitting element 10 in the display device 100 according to the present embodiment. Note that FIG. 19 and FIG. 20 illustrate a cross section of the display device 100 corresponding to the cross section of the light-emitting element 10 illustrated in FIG. 18. FIG. 19 illustrates a manufacturing step after the manufacturing step in S6 in FIG. 5. FIG. 20 illustrates a manufacturing step after the manufacturing step illustrated in FIG. 19.

In the present embodiment, after step S1 to step S6 are performed as in the first embodiment, as illustrated in S21 in FIG. 19, a conductive layer 17 made of a conductive material, to be the CA 7, is formed in a solid form on the electron transport material layer 15 and the insulating film 14 (step S21).

Various known methods for forming a cathode, such as vapor deposition and sputtering, can be used for forming the conductive layer 17.

Next, as illustrated in S22 in FIG. 19, a mask 114 is formed, on the conductive layer 17 as an etching mask, for patterning and forming the CA 7 and the ETL 5 having the shape illustrated in FIG. 17 and FIG. 18 (step S22).

As the mask 114, a resist pattern may be formed with general photolithography, or instead of the resist pattern, a metal mask may be used to cover the pattern forming region of the CA 7 and the ETL 5.

Next, as illustrated in S23 in FIG. 19, a portion of the conductive layer 17 and the electron transport material layer 15 not covered by the mask 114 is removed by wet etching or dry etching. The mask 114 is then removed. As a result, the CA 7 and the ETL 5 of an island shape having a desired pattern is formed (step S23).

Next, as illustrated in S9 to S11 in FIG. 20, steps S9 to S11 are performed as in the first embodiment, except that the CA 7 having a shape geometrically similar to that of the ETL 5 is formed on the ETL 5. Then, the light-emitting element 10 is sealed with the sealing resin 21 and the sealing substrate 22, whereby the display device 100 as illustrated in FIG. 17 and FIG. 18 is manufactured.

Thus, in the present embodiment, the display device 100 is manufactured with step S21 to step S23 performed instead of step S7, step S8, and step S12. Also in the present embodiment, as illustrated in S11 in FIG. 20, the formation condition such as the layer thickness of the EML 6 is adjusted to make the height of upper surface of the EML 6 lower than the heights of the upper surface of the protruding portion 3a and the upper surface of the ETL 5. Thus, also in the present embodiment, the CA 7 is formed so as not to be in contact with the EML 6 although the CA 7 is in contact with the entire upper surface of the ETL 5 in the present embodiment. Thus, also in the present embodiment, layering of the CA 7 on the EML 6 results in no process damage on the EML 6. Furthermore, the light extraction efficiency can be improved, because the light is not absorbed by the CA 7 in the light extraction direction.

Thus, according to the present embodiment, in addition to the effect of the first embodiment, as described above, the CA 7 and the ETL 5 can be patterned collectively, whereby the CA 7 and the ETL 5 can be easily formed. Note that when the AN 2 is the upper electrode, the AN 2 and the HTL 3 can be patterned collectively, whereby the AN 2 and the HTL 3 can be easily formed.

Fourth Embodiment

Differences from the first to the third embodiments will be described in the present embodiment. Note that, for convenience of description, components having the same function as the components described in the first to the third embodiments are designated by the same reference numbers, and descriptions thereof are omitted.

Figure 21:
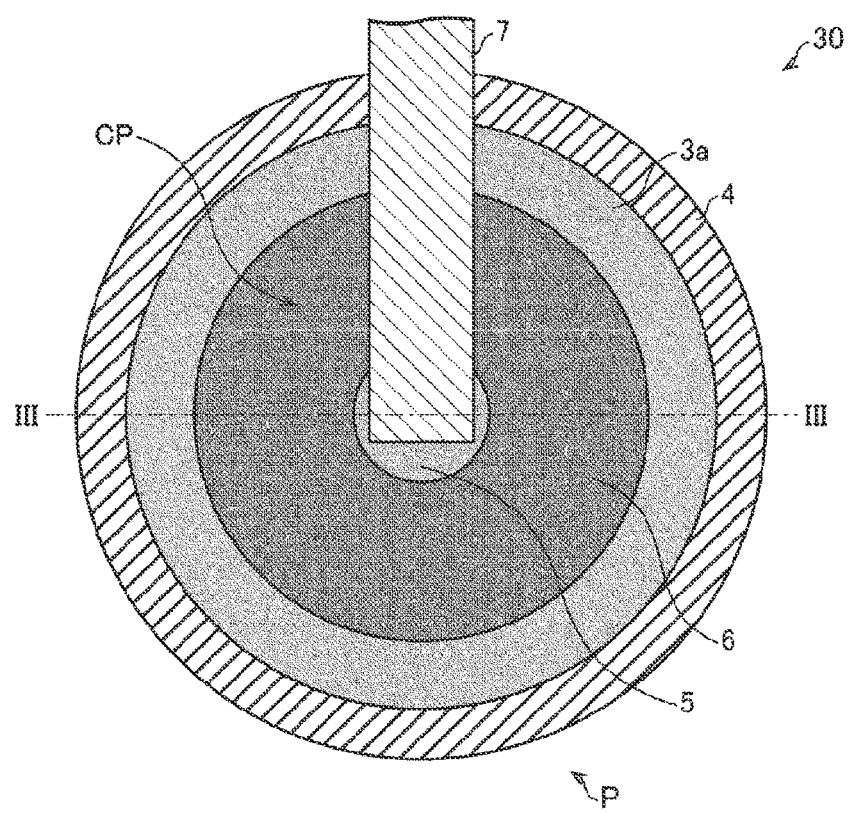
FIG. 21 is a plan view illustrating a schematic configuration of main portions of a light-emitting element according to a fourth embodiment as viewed from the upper side.
Figure 22:
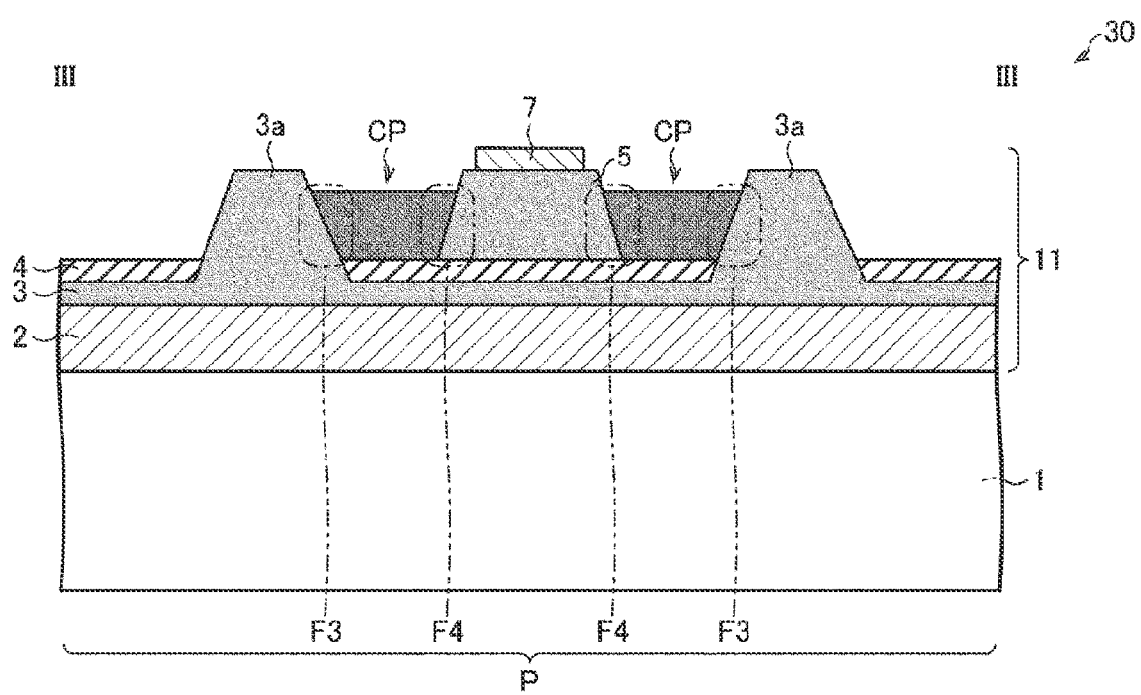
FIG. 22 is a cross-sectional view illustrating a schematic configuration of main portions of the light-emitting element illustrated in FIG. 21 taken along line in FIG. 21.

FIG. 21 is a plan view illustrating a schematic configuration of main portions of a light-emitting element 30 according to the present embodiment as viewed from the upper side. FIG. 22 is a cross-sectional view illustrating a schematic configuration of main portions of the light-emitting element 30 illustrated in FIG. 21 taken along line in FIG. 21.

The light-emitting element 30 according to the present embodiment has the same configuration as the light-emitting element 10 according to the first embodiment except for the following points. Although not illustrated, the display device 100 according to the present embodiment includes the light-emitting element 30 described below, instead of the light-emitting element 10. As illustrated in FIG. 21 and FIG. 22, the light-emitting element 30 according to the present embodiment has the HTL 3 having a concentric shape around the ETL 5 in plan view. More specifically, in the light-emitting element 30, the ETL 5 is positioned at the center of the pixel P, and the protruding portion 3a surround the ETL 5 while forming a frame shape to surround the outer circumference of the ETL 5.

The HTL 3 has a shape geometrically similar to that of the ETL 5 in plan view. In the example illustrated in FIG. 21 and FIG. 22, the ETL 5 has a circular shape, and the HTL 3 is formed in a circular shape including the protruding portion 3a having an annular shape (that is a circular frame shape) in plan view.

In the present embodiment, the EML 6 is formed in the recessed portion CP surrounded by the HTL 3, the IL 4, and the ETL 5. In other words, the EML 6 is formed in the recessed portion CP including as parts of the side walls, the protruding portions 3a, the IL 4, and the ETL 5. As described above, in the light-emitting element 30, the protruding portion 3a has a frame shape surrounding the outer circumference of the ETL 5, and thus no bank BK is required for forming the recessed portion CP and for separation between the pixels P.

Part of the EML 6 is formed to overlap on part of the HTL 3, as illustrated in an area surrounded by a frame F3 illustrated in a two-dot chain line in FIG. 22. The EML 6 is formed to have a portion overlapping on part of the ETL 5, as illustrated in an area surrounded by a frame F4 illustrated in two-dot chain lines in FIG. 22.

Note that in the light-emitting element 30, the CA 7 may be formed in an island shape in each pixel P, and the AN 2 may be formed to be common to the pixels P, or the AN 2 may be formed in an island shape in each pixel P, and the CA 7 may be formed to be common to the pixels P. The CA 7 is sufficient to be in electrical contact with part of the ETL 5, and may be routed between adjacent pixels P.

In the present embodiment, for example, in S3 illustrated in FIG. 4 and in S4 illustrated in FIG. 5, the HTL 3 is formed in a circular shape having the protruding portion 3a in an annular shape as illustrated in FIG. 21. In S7 and S8 illustrated in FIG. 6, in plan view, the ETL 5 in a circular shape having the protruding portion 3a in annular shape is formed at the center of the pixel P. Thereafter, in S9 and S10 illustrated in FIG. 16, the IL 4 is patterned and formed as in S9 and S10 illustrated in FIG. 16 without forming the bank BK. The light-emitting element 30 as illustrated in FIG. 21 and FIG. 22 as well as the display device 100 including the light-emitting element 30 can be manufactured through steps as those in the second embodiment, except for the points described above.

As described above, the light-emitting element 30 according to the present embodiment includes the AN 2, the HTL 3, the CA 7, the ETL 5, and the EML 6, as in the light-emitting element 10. In addition, at least part of the EML 6 overlaps on part of the HTL 3, and part of the EML 6 overlaps on part of the ETL 5. The HTL 3 and the ETL 5 face each other with the EML 6 provided in between, in plan view. Accordingly, the present embodiment can also obtain similar advantageous effects to those of the first embodiment.

Furthermore, with the present embodiment, in FIG. 21 and FIG. 22, an electrical field in the lateral direction (that is, the electrical field in the in-plane direction of the EML 6) is uniformly distributed in the periphery, whereby the light can be emitted uniformly in the planar direction.

Modified Example

FIG. 23 to FIG. 26 are each a plan view illustrating a schematic configuration of main portions of the light-emitting element 30 according to the present modified example, as viewed from the upper side.

Figure 23:
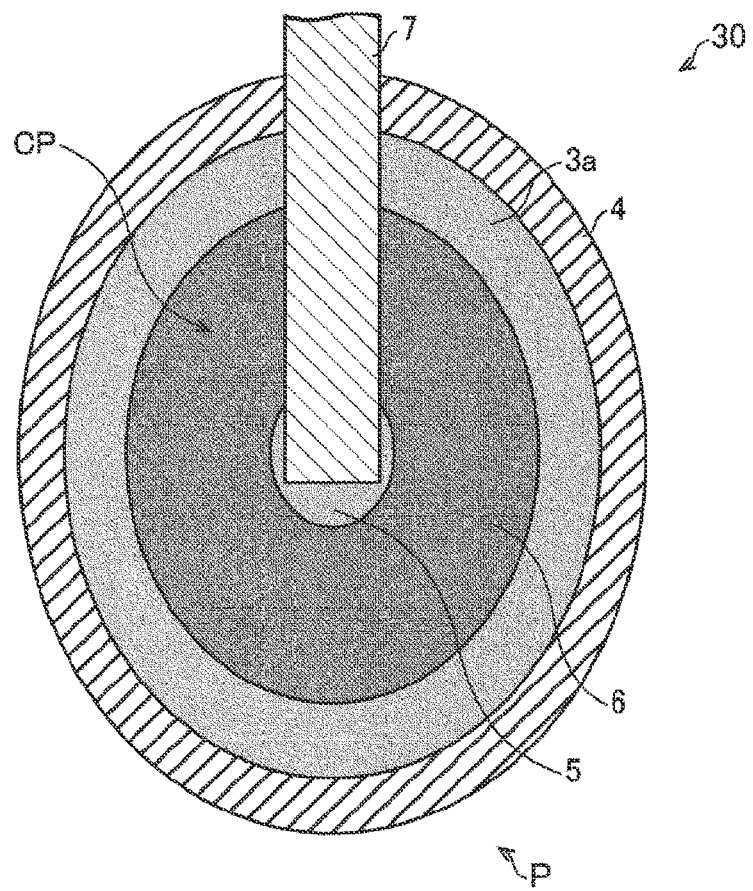
FIG. 23 is a plan view illustrating a schematic configuration of main portions of the light-emitting element according to Modified Example of the fourth embodiment as viewed from the upper side.
Figure 24:
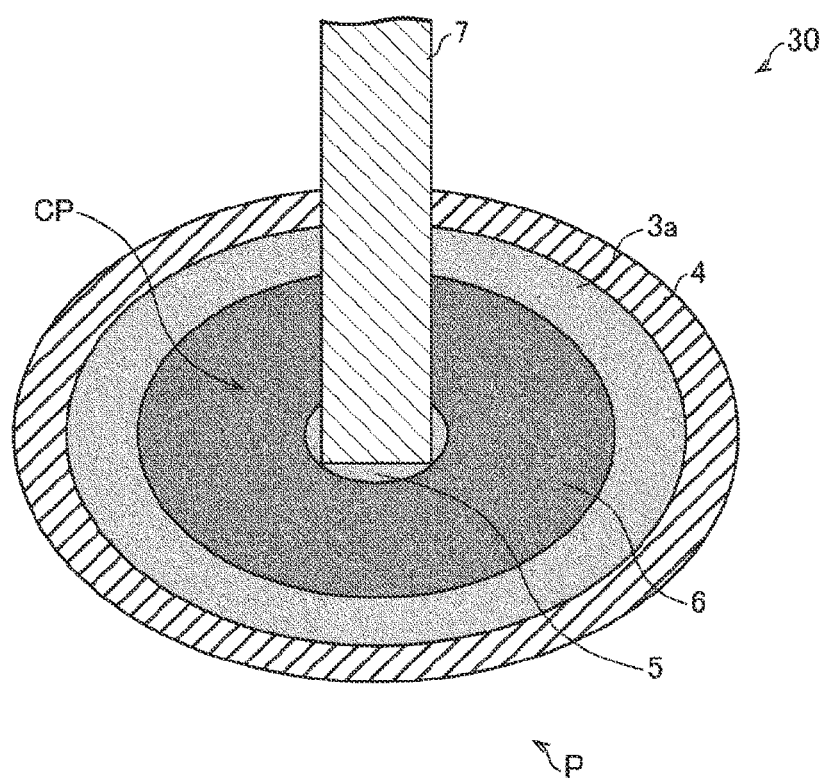
FIG. 24 is another plan view illustrating a schematic configuration of main portions of the light-emitting element according to Modified Example of the fourth embodiment as viewed from the upper side.
Figure 25:
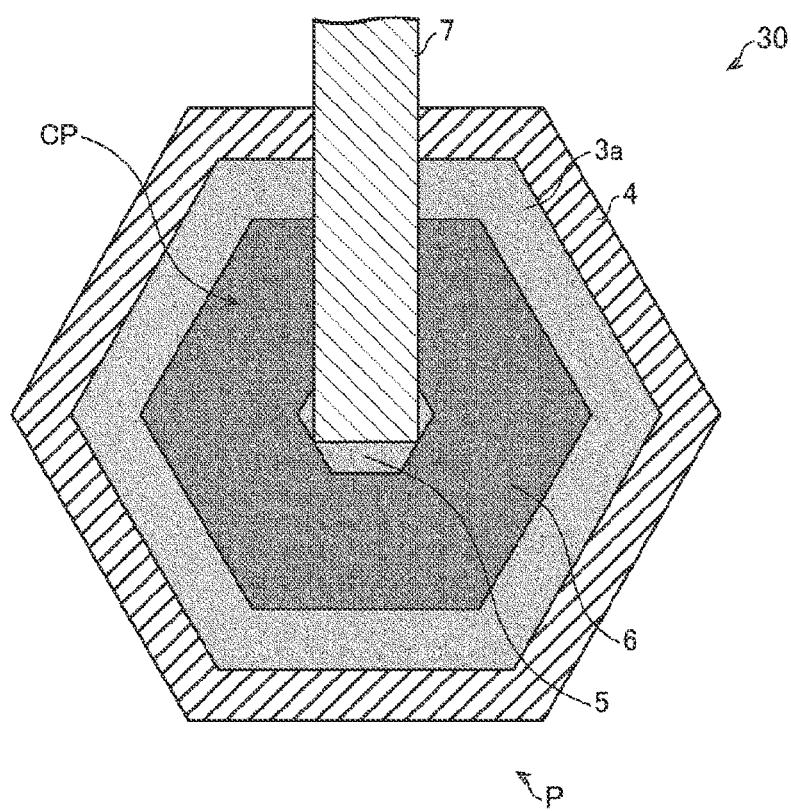
FIG. 25 is still another plan view illustrating a schematic configuration of main portions of the light-emitting element according to Modified Example of the fourth embodiment as viewed from the upper side.

In any of the light-emitting elements 30 illustrated in FIG. 23 to FIG. 25, the HTL 3 has a concentric shape around the ETL 5, with the protruding portion 3a having a frame shape surrounding the outer circumference of the ETL 5 in plan view. In any of the examples, the HTL 3 has a shape geometrically similar to that of the ETL 5 in plan view. Note that in plan view, the outer shape of the pixel P is the same as that of the HTL 3.

As illustrated in FIG. 23, the HTL 3 and the ETL 5 may be formed in a vertical oval shape with the axis in the vertical direction being longer than the axis in the lateral direction in plan view. As illustrated in FIG. 24, the HTL 3 and the ETL 5 may be formed in a lateral oval shape with the axis in the lateral direction being longer than the axis in the vertical direction in plan view. In addition, as illustrated in FIG. 25, the HTL 3 and the ETL 5 may be formed in a regular polygon shape in plan view (a regular polygon with n corners, n being an integer that is equal to or larger than 3). FIG. 25 illustrates an example in which the HTL 3 and the ETL 5 are formed in a regular hexagonal shape with n=6. However, with a regular pentagonal shape with n=5 and a polygon with n being an integer multiple of 5, the plurality of pixels P cannot be formed to be arranged without any gap between the pixels P. Therefore, it is preferable that n≠(integer multiple of 5).

Figure 26:
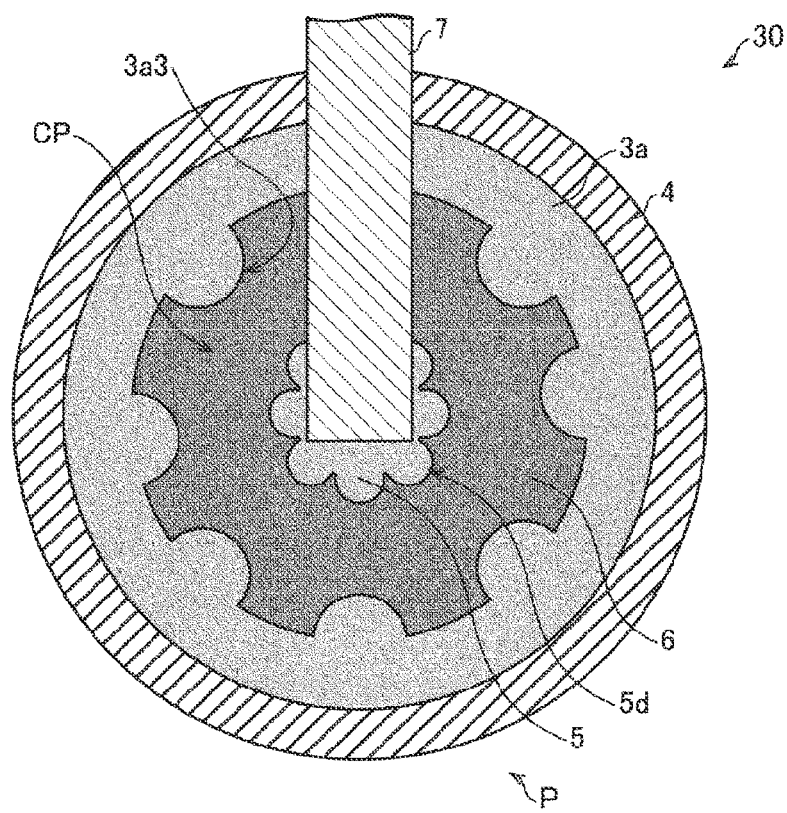
FIG. 26 is still another plan view illustrating a schematic configuration of main portions of the light-emitting element according to Modified Example of the fourth embodiment as viewed from the upper side.

The protruding portion 3a and the ETL 5 illustrated in FIG. 23 to FIG. 25 may each have recesses and protrusions to be in a comb shape in plan view. FIG. 26 illustrates, as an example, a case where the protruding portion 3a and the ETL 5 illustrated in FIG. 23 are provided with recesses and protrusions to be in a comb shape in plan view. The ETL 5 illustrated in FIG. 26 includes, on a surface facing the protruding portions 3a, protruding portions 5d protruding in the recessed portion CP to be in a comb teeth shape in plan view. The protruding portion 3a illustrated in FIG. 26 includes, on a surface facing the ETL 5, protruding portions 3a3 protruding in the recessed portion CP to be in a comb teeth shape in plan view.

With the HTL 3 and the ETL 5 (that is the protruding portions 3a and the ETL 5) facing each other in plan view thus having a comb-shaped structure in plan view, carrier injection with the HTL 3 and the ETL 5 can further be improved. Furthermore, the aspect ratio of EML 6 can be substantially reduced.

Note that in FIG. 21 to FIG. 26, a case where the HTL 3 has the concentric shape around the ETL 5 in plan view is illustrated as an example. It is a matter of course that the ETL 5 may have a concentric shape around the HTL 3.

Fifth Embodiment

Differences from the first to the fourth embodiments will be described in the present embodiment. Note that, for convenience of description, components having the same function as the components described in the first to the fourth embodiments are designated by the same reference numbers, and descriptions thereof are omitted.

Schematic Configuration of Display Device 100 and Light-Emitting Element 40

Figure 27:
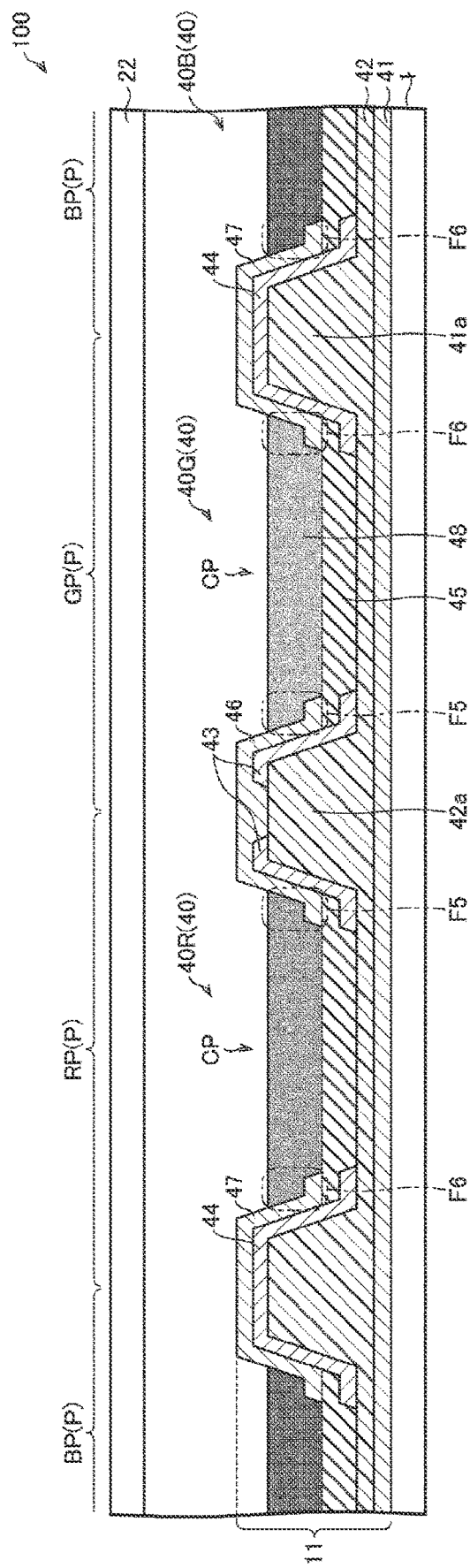
FIG. 27 is a cross-sectional view illustrating a schematic configuration of main portions of a display device according to a fifth embodiment.

FIG. 27 is a cross-sectional view illustrating a schematic configuration of main portions of the display device 100 according to the present embodiment.

As illustrated in FIG. 27, the display device 100 according to the present embodiment has the same configuration as the display device 100 according to the first embodiment, except that a light-emitting element 40 is provided instead of the light-emitting element 10. Accordingly, in the present embodiment, the red pixel RP is provided with a light-emitting element 40R that emits red light. The green pixel GP is provided with a light-emitting element 40G that emits green light. The blue pixel BP is provided with a light-emitting element 40B that emits blue light. In the present embodiment, when there is no need to distinguish the light-emitting elements 40R, 40G, and 40B from one another, these light-emitting elements 40R, 40G, and 40B are collectively referred to as simply a "light-emitting element 40".

In the following description, for the sake of description, a light-reflective electrode is referred to as "RE" and a resin layer is referred to as "RL".

As illustrated in FIG. 27, the light-emitting element 40 includes an RE 41, an RL 42, an AN 43, a CA 44, an IL 45, an HTL 46, an ETL 47, an EML 48, and the bank BK (not illustrated).

Hereinafter, an example is described where the AN 43 is a pixel electrode (first electrode) formed in an island shape for each pixel P, and the CA 44 is a common electrode (second electrode) common to the pixel P. However, the present embodiment is not limited to this, and the CA 44 may be the pixel electrode (first electrode) and the AN 43 may be the common electrode.

The display device 100 according to the present embodiment is a top-emitting display device in which light generated by the EML 6 is emitted from the side opposite to the substrate 1, as in the case of the display device 100 according to the first embodiment.

The RE 41 is formed, on the substrate 1, to be in a solid form to cover the surface of the substrate 1. Examples of the conductive material used in the RE 41 include metals having light reflectivity, such as Al, Ag, or Mg; alloys of these metals; and the like.

According to the present embodiment, with the RE 41 provided, and light can be easily extracted in the upper surface direction of the EML 48.

The RL 42 is a common layer common to the pixels P, and is formed, on the RE 41, to be in a solid form to cover the surface of the RE 41. The RL 42 includes a plurality of protruding portions 42a protruding toward the upper side. The protruding portions 42a are provided to protrude in a direction perpendicular to the surface of the substrate 1 for example.

Although not illustrated, also in the present embodiment, the plurality of pixels P are disposed along the lateral direction and the vertical direction to be in a matrix shape, in the display region of the display device 100. Each pixel P is formed, for example, in a rectangular shape. The protruding portions 42a are provided on the boundary, along the vertical direction, between pixels P adjacent to each other in the lateral direction, while being separated from each other along the boundary (that is, the vertical direction), in plan view for example.

Examples of the material of the RL 42 includes an organic insulating material such as polyimide or acrylic resin. The height of the protruding portion 42a is, for example, in the range from several hundreds of nanometers to several micrometers. The protruding portions 42a may be formed to have such a height that the sum of the layer thickness of the IL 45 and the layer thickness of the EML 48 becomes smaller than the sum of the height of the protruding portion 42a, the layer thickness of the AN 43, and the layer thickness of the HTL 46, with the layer thickness of the EML 6 set within the range described above. As a result, the height of the upper surface of the EML 48 becomes smaller than the heights of the upper surface of the HTL 46 and the upper surface of the ETL 47.

The layer thickness of the RLs 42 between the protruding portions 42a may be any processable thickness, guaranteeing insulation between the RE 41 and the AN 43 and between the RE 41 and the CA 44. The layer thickness of the RL 42 between the protruding portions 42a is preferably within a range from 20 nm to 100 nm for example. When the layer thickness of the RL 42 between the protruding portions 42a is equal to or greater than 20 nm, the insulation can be guaranteed without being affected by the tunneling effect. Considering the height of the protruding portions 42a, to form the protruding portions 42a protruding toward the upper side beyond the RL 42 between the protruding portions 42a in the RL 42, the layer thickness of the RL 42 between the protruding portions 42a is preferably equal to or less than 100 nm. With the layer thickness of the RL 42 between the protruding portions 42a being equal to or less than 100 nm, each RL 42 between the protruding portions 42a can have a uniform thickness.

The AN 43 and the CA 44 are separated from each other and to cover at least part of side surfaces of protruding portions 42a adjacent to each other.

FIG. 27 illustrates an example where the AN 43 is a pixel electrode formed in an island shape in each pixel P, and the ANs 43 of the adjacent pixels P are separated from each other on the upper surface of the protruding portions 42a. Thus, in the example illustrated in FIG. 27, one side surface and the other side surface of the protruding portion 42a are covered by the respective ANs 43 in the pixels P adjacent to each other. The AN 43 in each pixel P covers a section to part of the side surface from part of the upper surface of the protruding portion 42a in each pixel P.

On the other hand, the CA 44 is a common electrode common to the pixels P, and is provided from one side surface to the other side surface of the protruding portion 42a adjacent to the protruding portion 42a provided with the AN 43.

With the AN 43 made of a conductive material, positive holes are injected to the EML 48 via the HTL 46. With the CA 44 made of a conductive material, electrons are injected into the EML 48 via the ETL 47.

Conductive materials that are the same as those for the AN 2 and the CA 7 can be used for the AN 43 and the CA 44. The AN 43 and CA 44 may be made of the same conductive material or may be made of materials with different work functions.

The HTL 46 (first carrier transport layer) is a layer with which positive holes are transported from the AN 43 to the EML 48, and is in electrical contact with the AN 43. The ETL 47 (second carrier transport layer) is a layer with which electrons are transported from the CA 44 to the EML 48, and is in electrical contact with the CA 44.

The HTL 46 covers at least part of the side surfaces of the protruding portion 42a on which the AN 43 is formed, with the AN 43 provided in between. The ETL 47 covers at least part of the side surfaces of the protruding portion 42a on which the CA 44 is formed, with the CA 44 provided in between. The HTL 46 and the ETL 47 are provided from one side surface to the other side surface of the respective protruding portions 42a adjacent to each other.

The HTL 46 has the same shape as the protruding portion 3a of the HTL 3 illustrated in FIG. 1, for example, in plan view. The ETL 47 has the same shape as the ETL 5 illustrated in FIG. 1, for example, in plan view.

Also in the present embodiment, banks BK that are the same as the banks BK illustrated in FIG. 1 are provided at the four corners of the pixel P. The banks BK provide insulation between the HTL 46 and the ETL 47, at the four corners of the pixel P. The banks BK are opaque, and function, together with the HTL 46 and the ETL 47 covering each protruding portion 42a, as separation walls with which the pixels P are separated from each other (that is, the light-emitting elements 40 are separated from each other). The bank BK is formed to have a height equal to or higher than the upper surface of the HTL 46 and the upper surface of the ETL 47.

The same material as that of the HTL 3 can be used for the HTL 46. The same material as that of the ETL 5 can be used for the ETL 47. The same material as that of the bank BK according to the first embodiment can be used for the bank BK.

On the RL 42 between the protruding portions 42a, the IL 45 is provided to cover an edge portion of each of the AN 43 and the CA 44 covering the protruding portions 42a. The IL 45 provides insulation between the AN 43 and the CA 44 adjacent to each other. Furthermore, the IL 45 also functions as an edge cover for the AN 43 and the CA 44. With this configuration, concentration of electrical field at the edge portions of the AN 43 and the CA 44 can be prevented.

Between the protruding portions 42a, the HTL 46 is formed on the AN 43 with the IL 45 provided in between. The HTL 46 has the edge portion provided to overlap with the edge portion of the AN 43 with the IL 45 provided in between. Furthermore, between the protruding portions 42a, the ETL 47 is formed on the CA 44 with the IL 45 provided in between. The ETL 47 has the edge portion provided to overlap with the edge portion of the CA 44 with the IL 45 provided in between. Between the protruding portions 42a, the IL 45 is formed to cover the entire upper surface of the RL 42 between the protruding portions 42a, below the HTL 46 and the ETL 47.

According to the present embodiment, with the IL 45 thus covering the entire upper surface of the RL 42 between the protruding portions 42a, current is forced to flow in a direction parallel to the surface of the substrate 1. Thus, according to the present embodiment, the light from the light-emitting element 40 can be uniformly emitted in planar direction.

The same insulating material as that of the IL 4 can be used for the IL 45. The RL 42 guarantees the insulation between the AN 43 and the RE 41 and between the CA 44 and the RE 41. Thus, the IL 45 is sufficient to have a layer thickness of 2 nm or greater, to be formable as a continuous film. Considering the height of the protruding portions 42a, to form the protruding portions 42a protruding toward the upper side beyond the IL 45, the layer thickness of the IL 45 is preferably equal to or less than 100 nm. With the layer thickness of the IL 45 being equal to or less than 100 nm, each IL 45 can have a uniform thickness.

The EML 48 is formed in the recessed portion CP surrounded by the IL 45, the HTL 46, the ETL 47, and the banks BK. In other words, the EML 48 is formed in the recessed portion CP including as parts of the side walls, the HTL 46, the ETL 47, and the banks BK.

The HTL 46 and the ETL 47 are each not positioned on the upper side of the EML 48, and face each other with the EML 48 provided in between in plan view. Similarly, the AN 43 and the CA 44 are each not positioned on the upper side of the EML 48, and face each other with the EML 48 provided in between in plan view.

The protruding portion 42a has a forwardly tapered shape in cross-sectional view. More specifically, the protruding portion 42a has a trapezoidal cross-sectional shape with the upper end being smaller than the lower end. Thus, the AN 43, the CA 44, the HTL 46, and the ETL 47 covering the protruding portion 42a each have a forward tapered outer shape in cross-sectional view, and have an inclined surface along the side wall of the protruding portion 42a.

The EML 48 is formed to have a portion overlapping on part of the ETL 47, as illustrated in an area surrounded by a frame F5 illustrated in two-dot chain lines in FIG. 27. The EML 48 is formed to have a portion overlapping on part of the HTL 46, as illustrated in an area surrounded by a frame F6 illustrated in two-dot chain lines in FIG. 27.

The EML 48 includes a light-emitting material, and emits light through recombination between the electrons transported from the CA 44 and the positive holes transported from the AN 43. As the light-emitting material described above, a light-emitting material that is the same as that used for the EML 6 can be used.

Manufacturing Method for Light-Emitting Element 40 and Display Device 100

Figure 28:
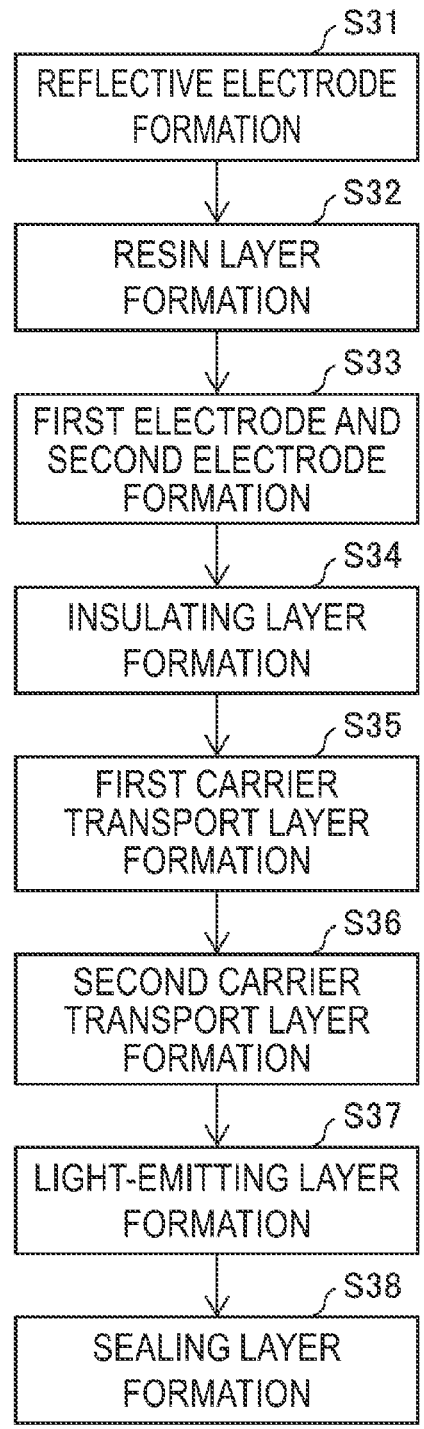
FIG. 28 is a flowchart illustrating, in order, steps as part of manufacturing steps for a light-emitting element and the display device according to the fifth embodiment.

Next, a manufacturing method for the light-emitting element 40 and the display device 100 according to the present embodiment will be described. FIG. 28 is a flowchart illustrating, in order, steps as part of manufacturing steps for the light-emitting element 40 and the display device 100 according to the present embodiment.

In the present embodiment, first of all, the substrate 1 as a support body is prepared as in the first embodiment. Then, on the substrate 1, the RE 41 is formed in a solid form over the entire display region of the substrate 1 (step S31, reflective electrode forming step).

The RE 41 can be formed in the manner that is the same as that for the AN 2 in the first embodiment.

Then, the RL 42 having a surface provided with a plurality of protruding portions 42a is formed on the RE 41 (step S32, resin layer forming step).

The RL 42 can be formed in the manner that is the same as that for the HTL 3 in the first embodiment. In the present embodiment, instead of step S2 in the first embodiment, the resin film to be the RL 42 is formed in a solid form on the RE 41. Then, as in step S3 in the first embodiment, a mask for processing a surface of the resin film to be in a recessed and protruding form, is formed as an etching mask on the resin film. Then, as in step S4 in the first embodiment, the surface of the resin film is etched by wet etching or dry etching, to process the surface of the resin film into a recessed and protruding form. Thereafter, the mask is removed. As a result, the RL 42 is formed.

Then, the AN 43 and the CA 44 are formed to cover at least part of the side surfaces of the protruding portions 42a adjacent to each other (step S33, first electrode and second electrode forming step).

The AN 43 and the CA 44 can be formed at once using the same material. The AN 43 and the CA 44 can be formed in a manner that is the same as that for the CA 7 in the first embodiment. Specifically, first of all, a conductive layer to be the AN 43 and the CA 44 are formed in a solid form on the RL 42, so as to cover the protruding portion 42a. Then, after the etching mask is formed on the conductive layer and the conductive layer is etched by wet etching or dry etching, the mask may be removed. Of course, the AN 43 and the CA 44 may be formed by printing, vapor deposition, CVD, or the like.

With the same material used for the AN 43 and the CA 44 as described above, the AN 43 and the CA 44 can be formed at once. Thus, the light-emitting element 40 can be formed more easily and in a shorter period of time.

However, the present embodiment is not limited thereto, and a conductive layer for adjusting the work function can be further formed and patterned on the conductive layer described above, to form the AN 43 and the CA 44 having different work functions.

Then, the IL 45 is formed, on the RL 42 between the protruding portions 42a, to cover the edge portion of each of the AN 43 and the CA 44 covering the protruding portions 42a (step S34, insulating layer forming step).

As in the case of the IL 4, various known methods for forming an insulating layer, such as sputtering, CVD, and application, can be used for forming the IL 45.

Then, the HTL 46 is formed with the AN 43 provided in between, to cover at least part of the side surfaces of the protruding portion 42a on which the AN 43 is formed (step S35, first carrier transport layer forming step). Specifically, the HTL 46 is formed on the IL 45 to lie over the protruding portion 42a on which the ANs 43 are formed.

Then, the ETL 47 is formed with the CA 44 provided in between, to cover at least part of the side surfaces of the protruding portion 41a on which the CA 44 is formed (step S36, second carrier transport layer forming step). Specifically, the ETL 47 is formed on the IL 45 to lie over the protruding portion 41a on which the CA 44 is formed.

The HTL 46 and the ETL 47 can be formed by a method that is the same as that for the HTL 3 and the ETL 5 in the first embodiment, by using an etching mask. Note that the order of the step S35 and step S36 may be reversed.

Next, the bank BK having a height equal to or higher than the upper surface of the HTL 46 and the upper surface of the ETL 47 is formed, using a method that is the same as that for forming the bank BK in the first embodiment. As a result, in each pixel P, the recessed portion CP surrounded by the IL 45, the HTL 46, the ETL 47, and the banks BK is formed.

Then, the EML 48 is formed in the recessed portion CP (step S37, light-emitting layer forming step). The EML 48 can be formed in the manner that is the same as that for the EML 6 in the first embodiment.

Then, as in the first embodiment, the light-emitting element 40 is sealed using the sealing resin 21 and the sealing substrate 22 (step S38, sealing layer forming step). In this manner, the display device 100 according to the present embodiment is manufactured.

As described above, the light-emitting element 40 according to the present embodiment includes the AN 43, the HTL 46, the CA 44, the ETL 47, and the EML 48, at least part of the EML 48 overlaps on part of the HTL 46, and part of the EML 48 overlaps on part of the ETL 47. The HTL 46 and the ETL 47 face each other with the EML 48 provided in between, in plan view.

Accordingly, with the light-emitting element 40, effects that are the same as those obtained by the light-emitting element 10 can be obtained. Accordingly, the present embodiment can also obtain similar advantageous effects to those of the first embodiment.

In the present embodiment, an example is described where the HTL 46 and the ETL 47 have the shapes that are the same as those of the protruding portion 3a of the HTL 3 and the ETL 5 illustrated in FIG. 1, in plan view. It is matter of course that the HTL 46 and the ETL 47 may have shapes that are the same as those of the protruding portion 3a of the HTL 3 and the ETL 5 illustrated in FIG. 12 or FIG. 13 in plan view.

Modified Example 1

Figure 29:
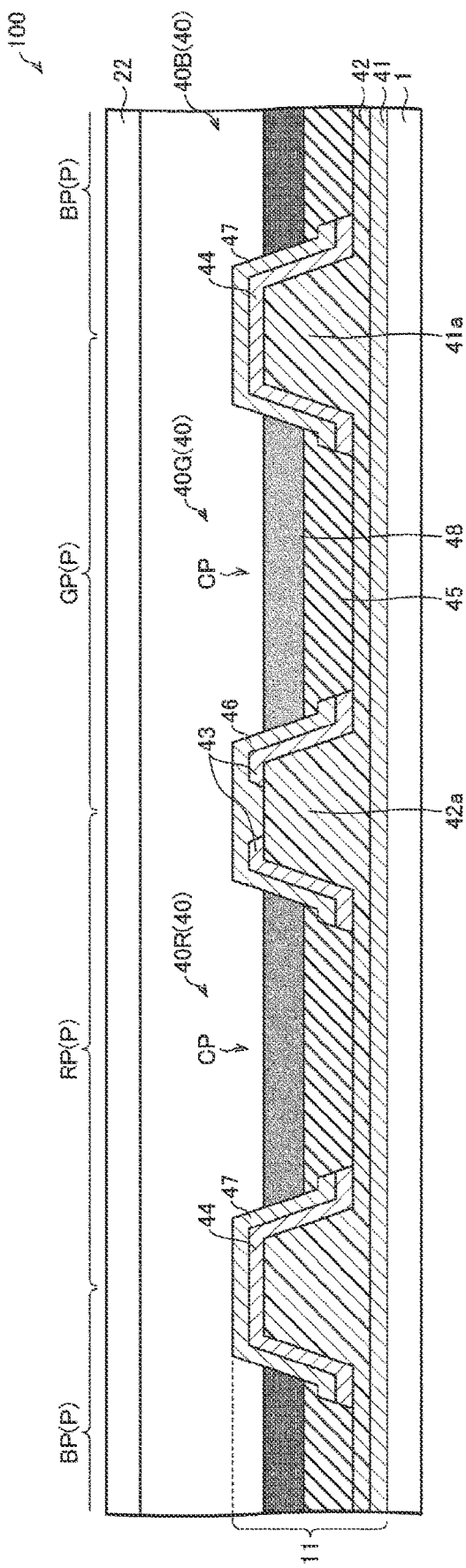
FIG. 29 is a cross-sectional view illustrating a schematic configuration of main portions of a display device according to Modified Example 1 of the fifth embodiment.

FIG. 29 is a cross-sectional view illustrating a schematic configuration of main portions of the display device 100 according to the present modified example.

In FIG. 28, step S34 (insulating layer forming step) may be performed between step S35 (first carrier transport layer forming step) and step S36 (second carrier transport layer forming step) and step S37 (light-emitting layer forming step).

In this manner, the light-emitting element 40 and the display device 100 illustrated in FIG. 29 can be manufactured, with the IL 45 thus formed between the protruding portions 42a adjacent to each other after forming the HTL 46 and the ETL 47.

The light-emitting element 40 and the display device 100 illustrated in FIG. 29 are the same as the light-emitting element 40 and the display device 100 illustrated in FIG. 27, except for the following points. In the present modified example, an edge portion of the HTL 46 is provided on an edge portion of the AN 43, while being in contact with the edge portion of the AN 43. An edge portion of the ETL 47 is provided on an edge portion of the CA 44, while being in contact with the edge portion of the CA 44. The IL 45 is provided to be an upper layer relative to the HTL 46 and the ETL 47, and covers the edge portion of each of the AN 43, the CA 44, the HTL 46, and the ETL 47.

According to the present modified example, concentration of electrical field at only each of the edge portions described above can be prevented, and the current flows in a direction parallel to the surface of the substrate 1. Thus, the light-emitting element 40 and the display device 100 enabling uniform light emission in the planar direction can be manufactured.

Modified Example 2

Figure 30:
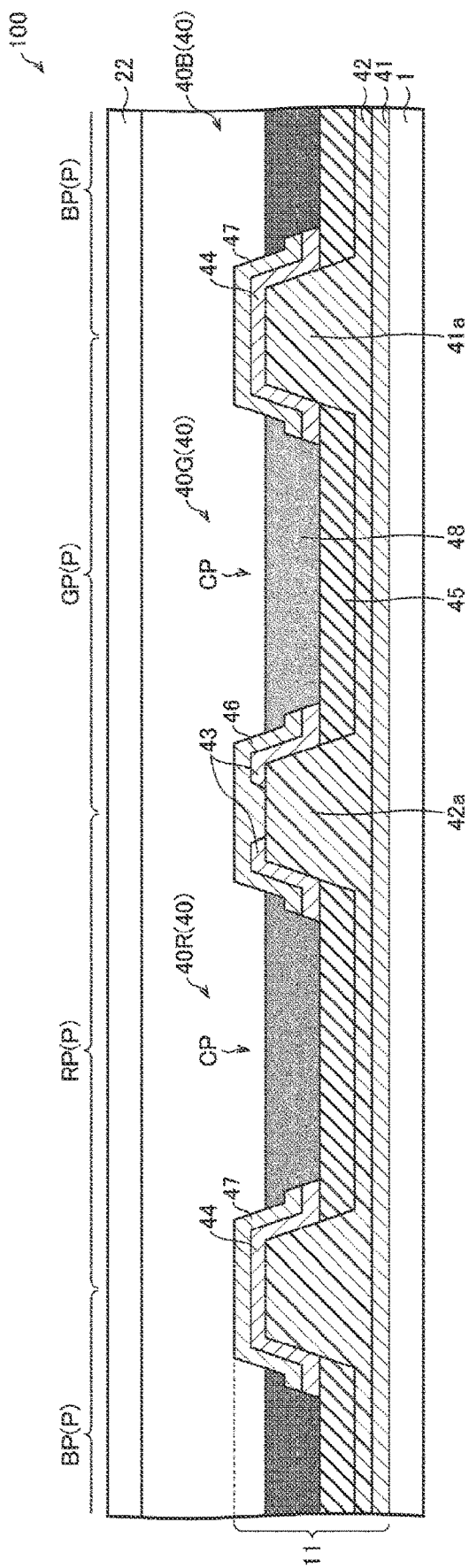
FIG. 30 is a cross-sectional view illustrating a schematic configuration of main portions of a display device according to Modified Example 2 of the fifth embodiment.

FIG. 30 is a cross-sectional view illustrating a schematic configuration of main portions of the display device 100 according to the present modified example.

In FIG. 28, step S34 (insulating layer forming step) can be performed between step S32 (resin layer forming step) and step S33 (first electrode and second electrode forming step).

According to the present modified example, the light-emitting element 40 and the display device 100 illustrated in FIG. 30 can be manufactured with the IL 45 formed between the protruding portions 42a adjacent to each other, before the AN 43 and the CA 44 are formed.

The light-emitting element 40 and the display device 100 illustrated in FIG. 30 are respectively the same as the light-emitting element 40 and the display device 100 illustrated in FIG. 27, except for the following points. In the present modified example, the IL 45 is provided to be a lower layer relative to the AN 43 and the CA 44, and covers the edge portion of the protruding portion 42a. The edge portions of the AN 43 and the CA 44 are provided on the IL 45. An edge portion of the HTL 46 is provided on an edge portion of the AN 43, while being in contact with the edge portion of the AN 43. An edge portion of the ETL 47 is provided on an edge portion of the CA 44, while being in contact with the edge portion of the CA 44.

According to the present modified example, concentration of electrical field at only the edge portion of the protruding portion 42a described above can be prevented, and the current flows in a direction parallel to the surface of the substrate 1. Thus, the light-emitting element 40 and the display device 100 enabling uniform light emission in the planar direction can be manufactured.

Modified Example 3

Figure 31:
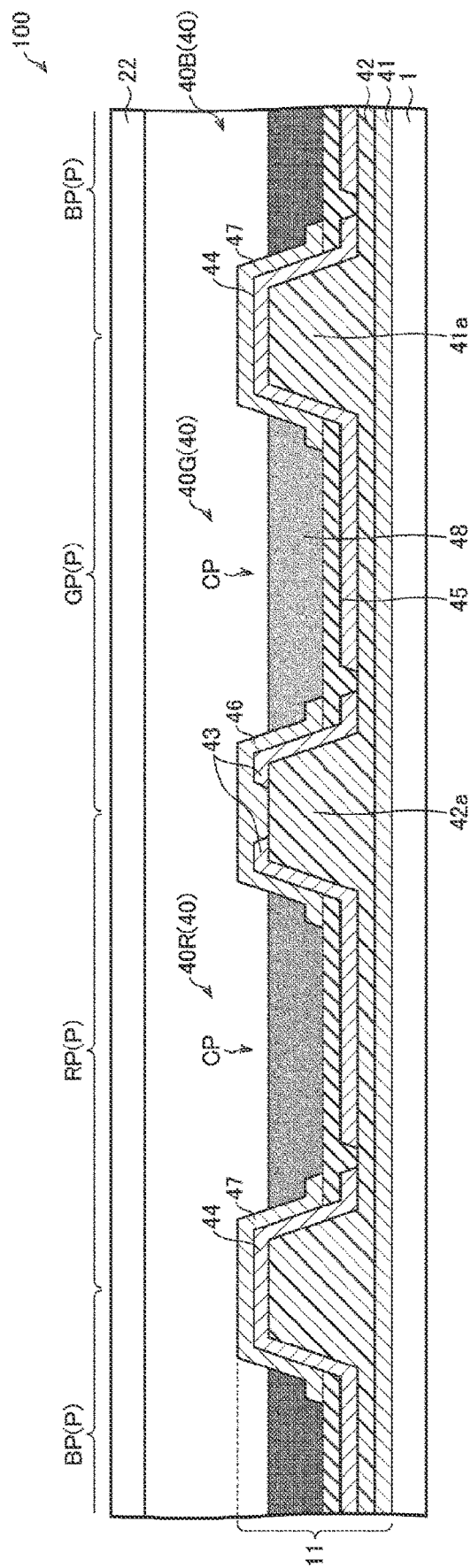
FIG. 31 is a cross-sectional view illustrating a schematic configuration of main portions of a display device according to Modified Example 3 of the fifth embodiment.

FIG. 31 is a cross-sectional view illustrating a schematic configuration of main portions of the display device 100 according to the present modified example.

The light-emitting element 40 and the display device 100 illustrated in FIG. 31 are respectively the same as the light-emitting element 40 and the display device 100 illustrated in FIG. 27, except for the following points. In the present modified example, the AN 43 and the CA 44 are each a light-reflective electrode. In the present modified example, instead of providing the RE 41, the CA 44, which is a common electrode, extends toward the edge portion of the AN 43, which is a pixel electrode, to a point close to the edge portion of the AN 43, between the protruding portions 42a. Thus, in the present modified example, the CA 44 extends on the bottom surface of the recessed portion CP. The IL 45 is formed over the entirety of the section between the protruding portions 42a, to cover the upper surface and the edge portion of the CA 44 between the protruding portions 42a, and to cover the edge portion of the AN 43.

The edge portion of the CA 44 and the edge portion of the AN 43 are preferably provided to be close to each other as much as possible as long as the insulation between the CA 44 and the AN 43 is guaranteed, and thus most preferably face each other while being separated from each other by a minimum distance guaranteeing the insulation between the CA 44 and the AN 43. Thus, the distance between the edge portion of the CA 44 and the edge portion of the AN 43 is preferably equal to or greater than 20 nm, which is a typical thickness of the IL 45, to provide the same level of insulation in the vertical direction and in the lateral direction. With a larger distance between the edge portion of the CA 44 and the edge portion of the AN 43, a recess is more likely to be formed at a portion immediately above a section between the edge portion of the CA 44 and the edge portion of the AN 43 when the IL 45 is formed. Thus, the distance is preferably equal to or less than 100 nm, for maintaining the uniformity of the IL 45.

In the present modified example, the RE 41 is not required, and thus the RL 42 is formed on the substrate 1 in step S32 (resin layer forming step) without performing the reflective electrode forming step in step S31. Then, in step S33 (first electrode and second electrode forming step), the CA 44 is formed to extend between the protruding portions 42a adjacent to each other. Thereafter, step S34 to step S38 illustrated in FIG. 28 are performed. Thus, the display device 100 according to the present modified example can be manufactured.

As described above, with the present modified example, the light-emitting element 40 with which light can be easily extracted in the upper surface direction of the EML 48 can be manufactured without the need for separately forming the RE 41.

In the present modified example, an example is described in which the AN 43 is the pixel electrode and the CA 44 is the common electrode. Still, as described above, the CA 44 may be the pixel electrode and the AN 43 may be the common electrode. Furthermore, instead of the CA 44, the AN 43 may extend toward the edge portion of the CA 44 to a point close to the edge portion of the CA 44, between the protruding portions 42a.

Modified Example 4

Figure 32:
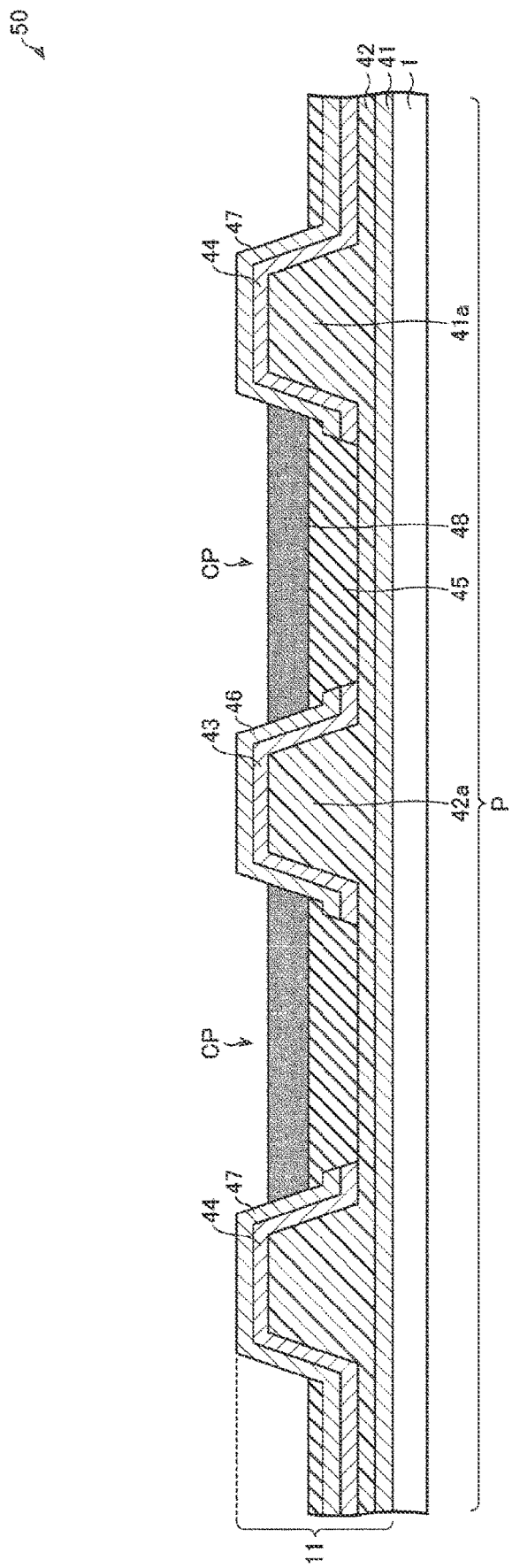
FIG. 32 is a cross-sectional view illustrating a schematic configuration of main portions of a light-emitting element of Modified Example 4 of the fifth embodiment.

FIG. 32 is a cross-sectional view illustrating a schematic configuration of main portions of a light-emitting element 50 according to the present modified example.

As in the light-emitting element 30 according to the third embodiment, in the light-emitting element 50, the HTL 46 and the ETL 47 may have a concentric shape in plan view, with one of them serving as a center and the other surrounding the outer circumference of the one.

In the example illustrated in FIG. 32, the ETL 47 has a concentric shape around the HTL 46. In the light-emitting element 50 illustrated in FIG. 32, the HTL 46 is positioned at the center of the pixel P, and the ETL 47 has a frame shape to surround the outer circumference of the HTL 46 to surround the HTL 46. The ETL 47 extends toward the adjacent pixel P.

The outer shape of the protruding portion 42a covered by the HTL 46 and the outer shape of the protruding portion 42a covered by the ETL 47 may be geometrically similar shapes in plan view. In plan view, the outer shape of the pixel P and the outer shape of the protruding portion 42a are geometrically similar shapes. The outer shapes of the protruding portion 42a and the pixel P may be any of a circular shape, a vertical oval shape, a lateral oval shape, and a regular polygonal shape (regular polygonal shape with n corners, n being an integer that is equal to or larger than 3). However, also in the present modified example, with a regular pentagonal shape with n=5 and a polygon with n being an integer multiple of 5, the plurality of pixels P cannot be formed to be arranged without any gap between the pixels P. Therefore, it is preferable that n≠(integer multiple of 5).

The HTL 46 and the ETL 47 in each pixel P may each include, on respective surfaces facing the other one, protruding portions protruding in a comb teeth shape in the recessed portion CP in plan view.

Also with the light-emitting element 50 according to the present modified example, the electrical field in the lateral direction is uniformly distributed in the periphery as in the fourth embodiment, whereby light can be emitted uniformly in the planar direction.

As described above, FIG. 32 illustrates an example where the AN 43 is the pixel electrode, the CA 44 is the common electrode, and the ETL 47 has a concentric shape around the HTL 46. However, it is a matter of course that the CA 44 may be the pixel electrode, the AN 43 may be the common electrode, and the HTL 46 may have a concentric shape around the ETL 47.

The disclosure is not limited to the embodiments described above, and various modifications may be made within the scope of the claims. Embodiments obtained by appropriately combining technical approaches disclosed in the different embodiments also fall within the technical scope of the disclosure. Furthermore, novel technical features can be formed by combining the technical approaches disclosed in each of the embodiments.

The invention claimed is:

1. A light-emitting element comprising:
   a first electrode;
   a first carrier transport layer in electrical contact with the first electrode;
   a second electrode separate from the first electrode;
   a second carrier transport layer in electrical contact with the second electrode;
   a light-emitting layer; and
   a resin layer including a plurality of protruding portions,
   wherein at least a part of the light-emitting layer overlaps with a part of the first carrier transport layer, and another part of the light-emitting layer overlaps with a part of the second carrier transport layer,
   in a plan view, the first carrier transport layer and the second carrier transport layer face each other with the light-emitting layer provided in between,
   the first electrode and the second electrode cover at least a part of side surfaces of adjacent protruding portions of the plurality of protruding portions,
   the first carrier transport layer covers at least a part of a side surface of a protruding portion of the plurality of protruding portions, on which the first electrode is formed, with the first electrode provided in between,
   the second carrier transport layer covers at least a part of a side surface of another protruding portion of the plurality of protruding portions, on which the second electrode is formed, with the second electrode provided in between, and
   the light-emitting layer is formed in a recessed portion including, as a part of a side wall, the first carrier transport layer and the second carrier transport layer.

2. The light-emitting element according to claim 1, further comprising:
   a reflective electrode,
   wherein the resin layer is formed on the reflective electrode.

3. The light-emitting element according to claim 1,
   wherein the first electrode and the second electrode are light-reflective electrodes, and
   at least one of the first electrode and the second electrode extends between the adjacent protruding portions of the plurality of protruding portions.

4. The light-emitting element according to claim 1,
   wherein the second carrier transport layer is made of a semiconductor.

5. The light-emitting element according to claim 4,
   wherein the first carrier transport layer and the second carrier transport layer are opaque.

6. The light-emitting element according to claim 1,
   wherein the first carrier transport layer is made of a semiconductor.

7. The light-emitting element according to claim 1,
   wherein a sealing layer is provided adjacent to the light-emitting layer and over the light-emitting layer.

8. The light-emitting element according to claim 1,
   wherein the first carrier transport layer and the second carrier transport layer are formed in a comb shape in plan view, with comb teeth portions of the first carrier transport layer and the second carrier transport layer alternately arranged and interdigitate with each other.

9. A display device comprising:
   the light-emitting element according to claim 1.

10. A light-emitting element comprising:
    a first electrode;
    a first carrier transport layer in electrical contact with the first electrode;
    a second electrode separate from the first electrode;
    a second carrier transport layer in electrical contact with the second electrode; and
    a light-emitting layer,
    wherein at least a part of the light-emitting layer overlaps with a part of the first carrier transport layer, and another part of the light-emitting layer overlaps with a part of the second carrier transport layer,
    in a plan view, the first carrier transport layer and the second carrier transport layer face each other with the light-emitting layer provided in between, and
    the first carrier transport layer and the second carrier transport layer have a concentric shape in the plan view, with one of the first carrier transport layer and the second carrier transport layer serving as a center and another one of the first carrier transport layer and the second carrier transport layer surrounding an outer circumference of the one of the first carrier transport layer and the second carrier transport layer.

11. A manufacturing method for manufacturing a light-emitting element including a first electrode, a first carrier transport layer in electrical contact with the first electrode, a second electrode separate from the first electrode, a second carrier transport layer in electrical contact with the second electrode, and a light-emitting layer, at least a part of the light-emitting layer overlapping with a part of the first carrier transport layer, and another part of the light-emitting layer overlapping with a part of the second carrier transport layer, and in a plan view, the first carrier transport layer and the second carrier transport layer facing each other with the light-emitting layer provided in between,
    the manufacturing method comprising:
    forming the first carrier transport layer;

forming the second carrier transport layer separate from the first carrier transport layer;

forming the light-emitting layer in a space portion between the first carrier transport layer and the second carrier transport layer in the plan view;

forming a resin layer including a plurality of protruding portions; and forming the first electrode and the second electrode such that to cover at least a part of side surfaces of adjacent protruding portions of the plurality of protruding portions, wherein the forming of the first carrier transport layer includes forming the first carrier transport layer such that to cover at least a part of a side surface of a protruding portion of the plurality of protruding portions, on which the first electrode is formed, with the first electrode provided in between, and the forming of the second carrier transport layer includes forming the second carrier transport layer such that to cover at least a part of a side surface of a protruding portion of the plurality of protruding portions, on which the second electrode is formed, with the second electrode provided in between.

12. The manufacturing method according to claim 11, further comprising:

forming a reflective electrode before the forming of the resin layer, wherein the forming of the resin layer includes forming the resin layer on the reflective electrode.

13. The manufacturing method according to claim 11, wherein the first electrode and the second electrode are light-reflective electrodes, and the forming of the first electrode and the second electrode includes forming at least one of the first electrode and the second electrode such that to extend between the adjacent protruding portions of the plurality of protruding portions.

* * * * *